United States Patent
Moriya et al.

(10) Patent No.: US 10,276,186 B2
(45) Date of Patent: *Apr. 30, 2019

(54) PARAMETER DETERMINATION DEVICE, METHOD, PROGRAM AND RECORDING MEDIUM FOR DETERMINING A PARAMETER INDICATING A CHARACTERISTIC OF SOUND SIGNAL

(71) Applicants: NIPPON TELEGRAPH AND TELEPHONE CORPORATION, Chiyoda-ku (JP); The University of Tokyo, Bunkyo-ku (JP)

(72) Inventors: Takehiro Moriya, Atsugi (JP); Yutaka Kamamoto, Atsugi (JP); Noboru Harada, Atsugi (JP); Hirokazu Kameoka, Atsugi (JP); Ryosuke Sugiura, Bunkyo-ku (JP)

(73) Assignees: NIPPON TELEGRAPH AND TELEPHONE CORPORATION, Chiyoda-ku (JP); The University of Tokyo, Bunkyo-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/544,452

(22) PCT Filed: Jan. 27, 2016

(86) PCT No.: PCT/JP2016/052362
§ 371 (c)(1),
(2) Date: Jul. 18, 2017

(87) PCT Pub. No.: WO2016/121824
PCT Pub. Date: Aug. 4, 2016

(65) Prior Publication Data
US 2018/0268843 A1 Sep. 20, 2018

(30) Foreign Application Priority Data

Jan. 30, 2015 (JP) ................. 2015-017690

(51) Int. Cl.
*H03M 7/30* (2006.01)
*G10L 19/02* (2013.01)
(Continued)

(52) U.S. Cl.
CPC .............. *G10L 25/18* (2013.01); *G10L 19/02* (2013.01); *G10L 19/038* (2013.01); *G10L 19/07* (2013.01);
(Continued)

(58) Field of Classification Search
CPC ......... G10L 19/04; G10L 19/06; G10L 19/07; G10L 19/16; G10L 19/0216; G10L 25/18;
(Continued)

(56) References Cited

U.S. PATENT DOCUMENTS 8,856,049 B2 * 10/2014 Vasilache ............... G10L 25/78
704/205
8,948,428 B2 * 2/2015 Kates ...................... G10L 25/00
381/312

(Continued)

FOREIGN PATENT DOCUMENTS

| EP | 2 827 328 A1 | 1/2015 |
| EP | 3 226 243 A1 | 10/2017 |

(Continued)

OTHER PUBLICATIONS

Extended European Search Report dated May 30, 2018 in corresponding European Patent Application No. 16743427.3, 14 pages.
(Continued)

*Primary Examiner* — Jesse A Elbin
(74) *Attorney, Agent, or Firm* — Oblon, McClelland, Maier & Neustadt, L.L.P.

(57) ABSTRACT

A parameter determination device includes: a spectral envelope estimating portion performing estimation of a spectral envelope using a parameter $\eta_0$ specified in a predetermined
(Continued)

method, regarding the $\eta_0$-th power of absolute values of a frequency domain sample sequence corresponding to a time-series signal as a power spectrum on the assumption that the parameter $\eta_0$ and a parameter $\eta$ are positive numbers; a whitened spectral sequence generating portion obtaining a whitened spectral sequence which is a sequence obtained by dividing the frequency domain sample sequence by the spectral envelope; and a parameter acquiring portion determining such a parameter $\eta$ that generalized Gaussian distribution with the parameter $\eta$ as a shape parameter approximates a histogram of the whitened spectral sequence.

15 Claims, 13 Drawing Sheets

(51) Int. Cl.
*G10L 19/07* (2013.01)
*G10L 19/16* (2013.01)
*G10L 25/03* (2013.01)
*G10L 25/18* (2013.01)
*G10L 25/21* (2013.01)
*G10L 19/038* (2013.01)

(52) U.S. Cl.
CPC .............. *G10L 19/16* (2013.01); *G10L 25/03* (2013.01); *G10L 25/21* (2013.01); *H03M 7/30* (2013.01); *G10H 2250/225* (2013.01); *G10H 2250/575* (2013.01)

(58) Field of Classification Search
CPC .............. G10L 25/21; G10H 2250/225; G10H 2250/575
USPC .................... 700/94; 704/204, 208, 219, 501
See application file for complete search history.

(56) References Cited

U.S. PATENT DOCUMENTS

| | | | |
|---|---|---|---|
| 9,570,057 B2 * | 2/2017 | Brown | .................. G10H 1/125 |
| 2007/0165956 A1 | 7/2007 | Song | |
| 2015/0088529 A1 | 3/2015 | Moriya et al. | |
| 2015/0106108 A1 | 4/2015 | Baeckstroem et al. | |
| 2017/0272766 A1 | 9/2017 | Moriya et al. | |
| 2018/0047401 A1 | 2/2018 | Moriya et al. | |
| 2018/0096694 A1 | 4/2018 | Moriya et al. | |

FOREIGN PATENT DOCUMENTS

| | | |
|---|---|---|
| EP | 3 252 758 A1 | 12/2017 |
| EP | 3 270 376 A1 | 1/2018 |
| WO | WO 2014/001182 A1 | 1/2014 |

OTHER PUBLICATIONS

Marie Oger et al., "Low-Complexity Wideband LSF Quantization by Predictive KLT Coding and Generalized Gaussian Modeling", 14th European Signal Processing Conference (EUSIPCO 2006), IEEE, XP32753272, Sep. 4-8, 2006, 5 pages.
Ryosuke Sugiura et al., "Golomb-Rice Coding Optimized via LPC for Frequency Domain Audio Coder", GlobalSIP 2014: Perception Inspired Multimedia Signal Processing Techniques, XP55446164, Dec. 1, 2014, pp. 1024-1028.
Marie Oger et al., "Transform Audio Coding with Arithmetic-Coded Scalar Quantization and Model-Based Bit Allocation", 2007 IEEE International Conference on Acoustics, Speech, and Signal Processing, XP 31463907, Apr. 15, 2007, pp. IV-545-IV-548.
International Search Report dated Mar. 15, 2016 in PCT/JP2016/052362 filed Jan. 27, 2016.
Takehiro Moriya, "Essential Technology for High-Compression Voice Encoding: Line Spectrum Pair (LSP)" NTT Technical Journal, vol. 26, No. 9, Sep. 2014, 11 Pages (with corresponding English version).
Korean Office Action dated Sep. 17, 2018 in Patent Application No. 10-2017-7019110 (with English translation), 13 pages.

* cited by examiner

PARAMETER DETERMINATION DEVICE, METHOD, PROGRAM AND RECORDING MEDIUM FOR DETERMINING A PARAMETER INDICATING A CHARACTERISTIC OF SOUND SIGNAL

TECHNICAL FIELD

The present invention relates to a technique for, in a technique for encoding a time-series signal such as a sound signal, determining a parameter indicating a characteristic of the time-series signal such as a sound signal.

BACKGROUND ART

As a parameter indicating a characteristic of a time-series signal such as a sound signal, a parameter such as LSP is known (see, for example, Non-patent literature 1).

Since LSP consists of multiple values, there may be a case where it is difficult to use LSP directly for sound classification and section estimation. For example, since the LSP consists of multiple values, it is not easy to perform a process based on a threshold for which LSP is used.

By the way, a parameter $\eta$ is proposed by the inventor though it is not publicly known. This parameter $\eta$ is a shape parameter that defines probability distribution to which encoding targets of arithmetic codes belong, in an encoding system for performing arithmetic encoding of quantized values of coefficients in a frequency domain, which uses, for example, such a linear prediction envelope that is used in the 3GPP EVS (Enhanced Voice Services) standard. The parameter $\eta$ has relevance to distribution of the encoding targets, and it is possible to perform efficient encoding and decoding by appropriately specifying the parameter $\eta$.

Further the parameter $\eta$ can be an indicator indicating a characteristic of a time-series signal. Therefore, the parameter $\eta$ can be used for techniques other than the encoding process described above, for example, for voice/acoustic related techniques for sound classification, sound section estimation and the like.

Furthermore, since the parameter $\eta$ consists of a single value, a process based on a threshold for which the parameter $\eta$ is used is easier in comparison with a process based on a threshold for which LSP is used. Therefore, the parameter $\eta$ can be easily used for sound classification and section estimation.

PRIOR ART LITERATURE

Non-Patent Literature

[Non-patent literature 1] Takehiro Moriya "Essential Technology for High-Compression Voice Encoding: Line Spectrum Pair (LSP)", NTT Technical Journal, September 2014, pp. 58-60

SUMMARY OF THE INVENTION

Problems to be Solved by the Invention

A technique for determining a parameter $\eta$ has not been proposed so far.

An object of the present invention is to provide a parameter determination device for determining the parameter $\eta$, a method, a program and a recording medium.

Means to Solve the Problems

According to a parameter determination device according to one aspect of the present invention, the parameter determination device is provided with: a spectral envelope estimating portion performing estimation of a spectral envelope using a parameter $\eta_0$ specified in a predetermined method, regarding the $\eta_0$-th power of absolute values of a frequency domain sample sequence corresponding to a time-series signal as a power spectrum on the assumption that the parameter $\eta_0$ and a parameter $\eta$ are positive numbers; a whitened spectral sequence generating portion obtaining a whitened spectral sequence which is a sequence obtained by dividing the frequency domain sample sequence by the spectral envelope; and a parameter acquiring portion determining such a parameter $\eta$ that generalized Gaussian distribution with the parameter $\eta$ as a shape parameter approximates a histogram of the whitened spectral sequence.

Effects of the Invention

It is possible to determine a parameter $\eta$.

DETAILED DESCRIPTION OF THE EMBODIMENT

[Parameter Determination Device and Method]

Figure 1:
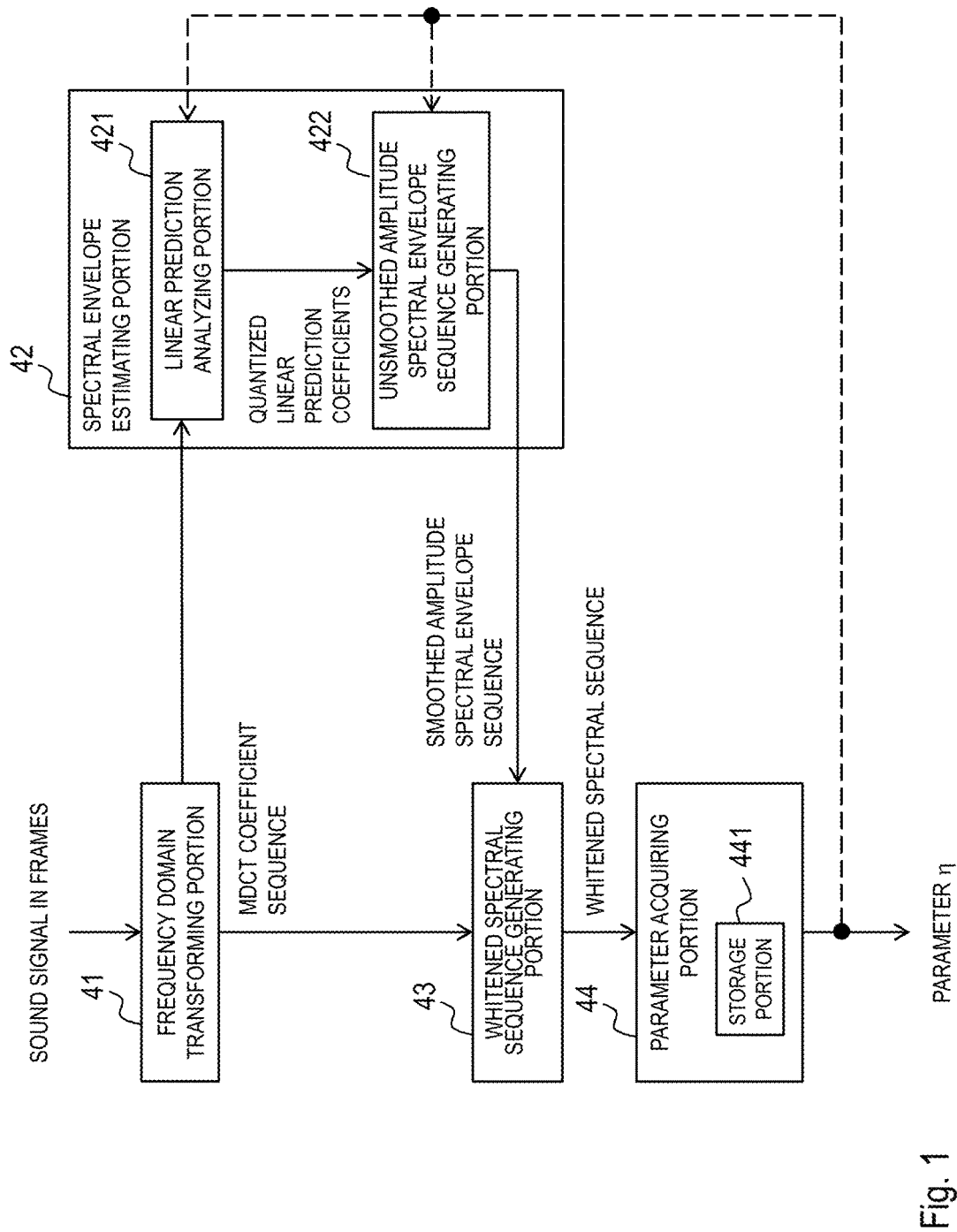
FIG. 1 is a block diagram for illustrating an example of a parameter determination device.
Figure 2:
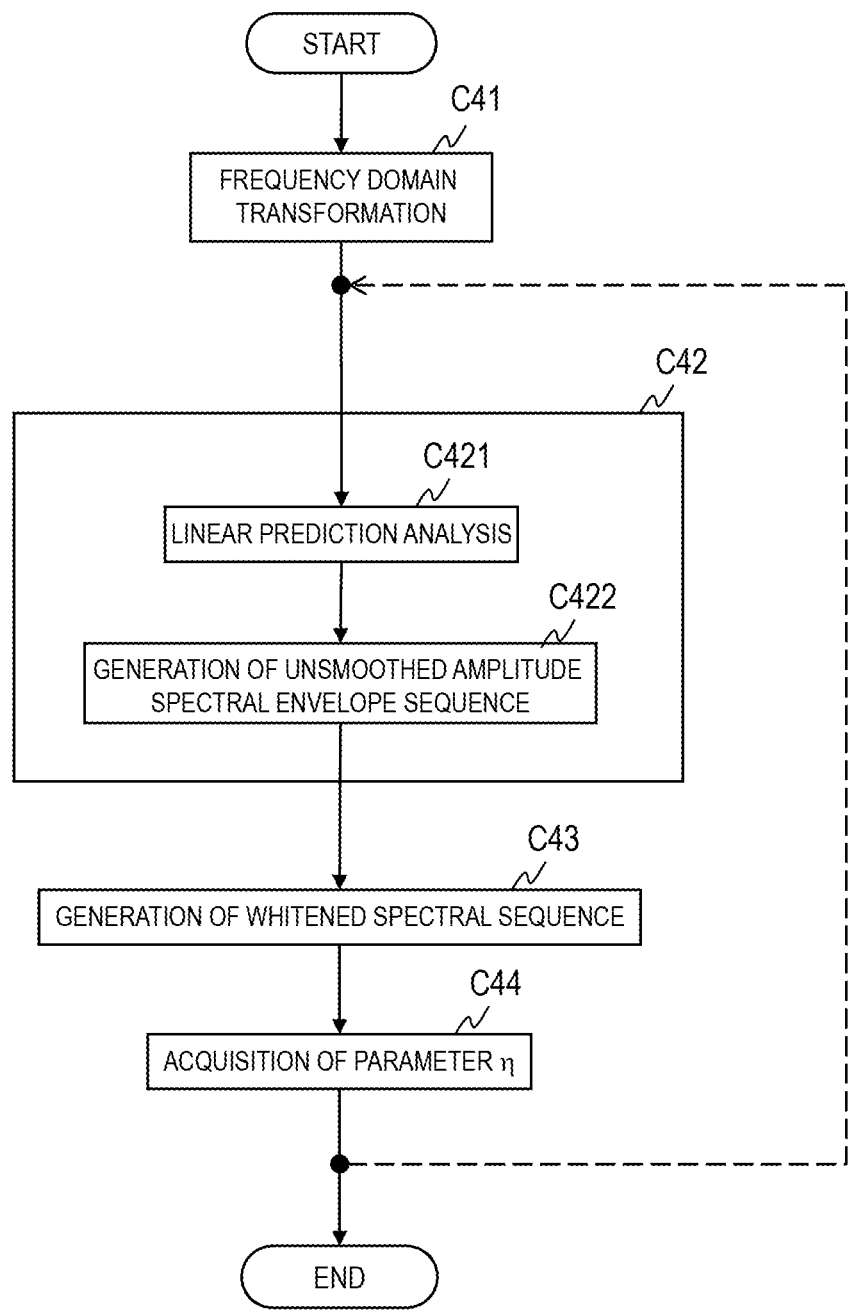
FIG. 2 is a flowchart for illustrating an example of a parameter determination method.

A configuration example of a parameter determination device is shown in FIG. 1. As shown in FIG. 1, the parameter determination device is provided with, for example, a frequency domain transforming portion 41, a spectral envelope estimating portion 42, a whitened spectral sequence generating portion 43, a parameter acquiring portion 44. The spectral envelope estimating portion 42 is provided with, for example, a linear prediction analyzing portion 421 and an unsmoothed amplitude spectral envelope sequence generating portion 422. For example, each process of a parameter determination method realized by this parameter determination device is shown in FIG. 2.

Each portion in FIG. 1 will be described below.

<Frequency Domain Transforming Portion 41>

A time domain sound signal, which is a time-series signal, is inputted to the frequency domain transforming portion 41. An example of the sound signal is a voice digital signal or an acoustic digital signal.

The frequency domain transforming portion 41 transforms the inputted time domain sound signal to an MDCT coefficient sequence X(0), X(1), . . . , X(N−1) at an N point in a frequency domain for each frame with a predetermined time length. Here, N indicates a positive integer.

The obtained MDCT coefficient sequence X(0), X(1), . . . , X(N−1) is outputted to the spectral envelope estimating portion 42 and the whitened spectral sequence generating portion 43.

It is assumed that subsequent processes are performed for each frame unless otherwise stated.

In this way, the frequency domain transforming portion 41 determines a frequency domain sample sequence, which is, for example, an MDCT coefficient sequence, corresponding to a sound signal (step C41).

<Spectral Envelope Estimating Portion 42>

The MDCT coefficient sequence X(0), X(1), . . . , X(N−1) obtained by the frequency domain transforming portion 42 is inputted to the spectral envelope estimating portion 42.

The spectral envelope estimating portion 42 performs estimation of a spectral envelope using the $\eta_0$-th power of absolute values of the frequency domain sample sequence corresponding to the time-series signal as a power spectrum, based on a parameter $\eta_0$ specified in a predetermined method (step C42).

The estimated spectral envelope is outputted to the whitened spectral sequence generating portion 43.

The spectral envelope estimating portion 42 performs the estimation of the spectral envelope, for example, by generating an unsmoothed amplitude spectral envelope sequence by processes of the linear prediction analyzing portion 421 and the unsmoothed amplitude spectral envelope sequence generating portion 422 described below.

It is assumed that the parameter $\eta_0$ is specified in a predetermined method. For example, it is assumed that $\eta_0$ is a predetermined number larger than 0. For example, $\eta_0=1$ is assumed. Further, $\eta$ determined for a frame before a frame for which the parameter $\eta$ is to be determined currently may be used. The frame before the frame for which the parameter $\eta$ is to be determined currently (hereinafter referred to as a current frame) is, for example, a frame before the current frame and in the vicinity of the current frame. The frame in the vicinity of the current frame is, for example, a frame immediately before the current frame.

<Linear Prediction Analyzing Portion 421>

The MDCT coefficient sequence X(0), X(1), . . . , X(N−1) obtained by the frequency domain transforming portion 41 is inputted to the linear prediction analyzing portion 421.

The linear prediction analyzing portion 421 generates linear prediction coefficients $\beta_1, \beta_2, \ldots, \beta_p$ by performing linear prediction analysis of ˜R(0), ˜R(1), . . . , ˜R(N−1) defined by the following expression (C1) using the MDCT coefficient sequence X(0), X(1), . . . , X(N−1), and encodes the generated linear prediction coefficients $\beta_1, \beta_2, \ldots, \beta_p$ to generate linear prediction coefficient codes and quantized linear prediction coefficients ^$\beta_1$, ^$\beta_2$, . . . , ^$\beta_p$, which are quantized linear prediction coefficients corresponding to the linear prediction coefficient codes.

[Expression 1]

$$\tilde{R}(k) = \sum_{n=0}^{N-1} |X(n)|^{\eta_0} \exp\left(-j\frac{2\pi k n}{N}\right), \quad (C1)$$
$$k = 0, 1, \ldots, N-1$$

The generated quantized linear prediction coefficients ^$\beta_1$, ^$\beta_2$, . . . , ^$\beta_p$ are outputted to the unsmoothed amplitude spectral envelope sequence generating portion 422.

Specifically, by performing operation corresponding to inverse Fourier transform regarding the $\eta_0$-th power of absolute values of the MDCT coefficient sequence X(0), X(1), . . . , X(N−1) as a power spectrum, that is, the operation of the expression (C1) first, the linear prediction analyzing portion 421 determines a pseudo correlation function signal sequence ˜R(0), ˜R(1), . . . , ˜R(N−1), which is a time domain signal sequence corresponding to the $\eta_0$-th power of the absolute values of the MDCT coefficient sequence X(0), X(1), . . . , X(N−1). Then, the linear prediction analyzing portion 421 performs linear prediction analysis using the determined pseudo correlation function signal sequence ˜R(0), ˜R(1), . . . , ˜R(N−1) to generate linear prediction coefficients $\beta_1, \beta_2, \ldots, \beta_p$. Then, by encoding the generated linear prediction coefficients $\beta_1, \beta_2, \ldots, \beta_p$, the linear prediction analyzing portion 421 obtains linear prediction coefficient codes and quantized linear prediction coefficients ^$\beta_1$, ^$\beta_2$, . . . , ^$\beta_p$ corresponding the linear prediction coefficient codes.

The linear prediction coefficients $\beta_1$, ^$\beta_2$, . . . , ^$\beta_p$ are linear prediction coefficients corresponding to a time domain signal when the $\eta_0$-th power of the absolute values of the MDCT coefficient sequence X(0), X(1), . . . , X(N−1) are regarded as a power spectrum.

Generation of the linear prediction coefficient codes by the linear prediction analyzing portion 421 is performed, for example, by a conventional encoding technique. An example of the conventional encoding technique is, for example, an encoding technique in which a code corresponding to a linear prediction coefficient itself is caused to be a linear prediction coefficient code, an encoding technique in which a linear prediction coefficient is transformed to an LSP parameter, and a code corresponding to the LSP parameter is caused to be a linear prediction coefficient code, an encoding technique in which a linear prediction coefficient is transformed to a PARCOR coefficient, and a code corresponding to the PARCOR coefficient is caused to be a linear prediction code, or the like.

In this way, the linear prediction analyzing portion 421 performs linear prediction analysis using a pseudo correlation function signal sequence obtained by performing inverse Fourier transform regarding the $\eta$-th power of absolute values of a frequency domain sample sequence, which is, for example, an MDCT coefficient sequence, as a power spectrum, and generates coefficients transformable to linear prediction coefficients (step C421).

When a parameter generated by the parameter determination device is used for a purpose other than encoding, the linear prediction analyzing portion 421 may not perform generation of linear prediction coefficient codes.

<Unsmoothed Amplitude Spectral Envelope Sequence Generating Portion 422>

The quantized linear prediction coefficients ^$\beta_1$, ^$\beta_2$, . . . , ^$\beta_p$ generated by the linear prediction analyzing portion 421 are inputted to the unsmoothed amplitude spectral envelope sequence generating portion 422.

The unsmoothed amplitude spectral envelope sequence generating portion 422 generates an unsmoothed amplitude spectral envelope sequence ^H(0), ^H(1), . . . , ^H(N−1), which is an amplitude spectral envelope sequence corresponding to the quantized linear prediction coefficients ^$\beta_1$, ^$\beta_2$, . . . , ^$\beta_p$.

The generated unsmoothed amplitude spectral envelope sequence ˆH(0), ˆH(1), . . . , ˆH(N−1) is outputted to the whitened spectral sequence generating portion 43.

The unsmoothed amplitude spectral envelope sequence generating portion 422 generates an unsmoothed amplitude spectral envelope sequence ˆH(0), ˆH(1), . . . , ˆH(N−1) defined by the following expression (C2) as the unsmoothed amplitude spectral envelope sequence ˆH(0), ˆH(1), . . . , ˆH(N−1) using the quantized linear prediction coefficients $\hat{\beta}_1, \hat{\beta}_2, \ldots, \hat{\beta}_p$.

[Expression 2]

$$\hat{H}(k) = \left( \frac{1}{2\pi} \frac{1}{\left|1 + \sum_{n=1}^{p} \hat{\beta}_n \exp(-j2\pi kn/N)\right|^2} \right)^{1/\eta_0} \quad (C2)$$

In this way, the unsmoothed amplitude spectral envelope sequence generating portion 422 performs estimation of a spectral envelope by obtaining an unsmoothed spectral envelope sequence, which is a sequence obtained by multiplying an amplitude spectral envelope sequence corresponding to a pseudo correlation function signal sequence by $1/\eta_0$, based on coefficients transformable to linear prediction coefficients generated by the linear prediction analyzing portion 421 (step C422).

<Whitened Spectral Sequence Generating Portion 43>

The MDCT coefficient sequence X(0), X(1), . . . , X(N−1) obtained by the frequency domain transforming portion 41 and the unsmoothed amplitude spectral envelope sequence ˆH(0), ˆH(1), . . . , ˆH(N−1) generated by the unsmoothed amplitude spectral envelope sequence generating portion 422 are inputted to the whitened spectral sequence generating portion 43.

The whitened spectral sequence generating portion 43 generates a whitened spectral sequence $X_W(0), X_W(1), \ldots, X_W(N-1)$ by dividing coefficients of the MDCT coefficient sequence X(0), X(1), . . . , X(N−1) by corresponding values of the unsmoothed amplitude spectral envelope sequence ˆH(0), ˆH(1), . . . , ˆH(N−1), respectively.

The generated whitened spectral sequence $X_W(0), X_W(1), \ldots, X_W(N-1)$ is outputted to the parameter acquiring portion 44.

The whitened spectral sequence generating portion 43 generates each of values $X_W(k)$ of the whitened spectral sequence $X_W(0), X_W(1), \ldots, X_W(N-1)$ by dividing coefficients X(k) of the MDCT coefficient sequence X(0), X(1), . . . , X(N−1) by values ˆH(k) of the unsmoothed amplitude spectral envelope sequence ˆH(0), ˆH(1), . . . , ˆH(N−1), respectively, for example, on the assumption of k=0, 1, . . . , N−1. That is, $X_W(k) = X(k)/\hat{H}(k)$ is satisfied on the assumption of k=0, 1, . . . , N−1.

In this way, the whitened spectral sequence generating portion 43 obtains a whitened spectral sequence which is a sequence obtained by dividing a frequency domain sample sequence which is, for example, an MDCT coefficient sequence by a spectral envelope which is, for example, an unsmoothed amplitude spectral envelope sequence (step C43).

<Parameter Acquiring Portion 44>

The whitened spectral sequence $X_W(0), X_W(1), \ldots, X_W(N-1)$ generated by the whitened spectral sequence generating portion 43 is inputted to the parameter acquiring portion 44.

The parameter acquiring portion 44 determines such a parameter η that generalized Gaussian distribution with the parameter η as a shape parameter approximates a histogram of the whitened spectral sequence $X_W(0), X_W(1), \ldots, X_W(N-1)$ (step C44). In other words, the parameter acquiring portion 44 determines such a parameter η that generalized Gaussian distribution with the parameter η as a shape parameter is close to distribution of the histogram of the whitened spectral sequence $X_W(0), X_W(1), \ldots, X_W(N-1)$.

The generalized Gaussian distribution with the parameter η as a shape parameter is defined, for example, as shown below. Here, Γ indicates a gamma function.

[Expression 3]

$$f_{GG}(X \mid \phi, \eta) = \frac{A(\eta)}{\phi} \exp\left(-\left|B(\eta)\frac{X}{\phi}\right|^\eta\right),$$

$$A(\eta) = \frac{\eta B(\eta)}{2\Gamma(1/\eta)}, \quad B(\eta) = \sqrt{\frac{\Gamma(3/\eta)}{\Gamma(1/\eta)}}, \quad \Gamma(x) = \int_0^\infty e^{-t} t^{x-1} dt$$

Figure 3:
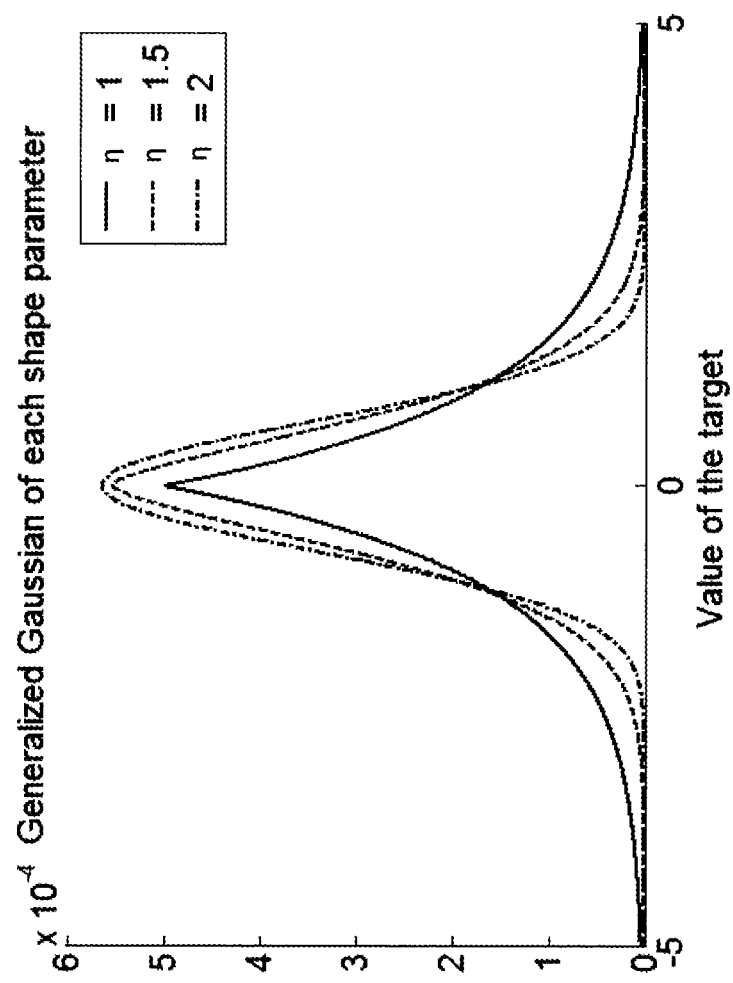
FIG. 3 is a diagram for illustrating generalized Gaussian distribution.

The generalized Gaussian distribution is such that makes it possible to express various distributions by changing η which is a shape parameter. For example, Laplace distribution and Gaussian distribution are expressed at the time of η=1 and at the time of η=2, respectively, as shown in FIG. 3. Here, φ is a parameter corresponding to variance.

Here, η determined by the parameter acquiring portion 44 is defined, for example, by an expression (C3) below. Here, $F^{-1}$ is an inverse function of a function F. This expression is derived from a so-called moment method.

[Expression 4]

$$\eta = F^{-1}\left(\frac{m_1}{\sqrt{m_2}}\right) \quad (C3)$$

$$F(\eta) = \frac{\Gamma(2/\eta)}{\sqrt{\Gamma(1/\eta)\Gamma(3/\eta)}}$$

$$m_1 = \frac{1}{N}\sum_{k=0}^{N-1} |X_W(k)|, \quad m_2 = \frac{1}{N}\sum_{k=0}^{N-1} |X_W(k)|^2$$

When the inverse function $F^{-1}$ is explicitly defined, the parameter acquiring portion 44 can determine the parameter η by calculating an output value when a value of $m_1/((m_2)^{1/2})$ is inputted to the explicitly defined inverse function $F^{-1}$.

When the inverse function $F^{-1}$ is not explicitly defined, the parameter acquiring portion 44 may determine the parameter η by a first method or a second method described below, in order to calculate a value of η defined by the expression (C3).

The first method for determining the parameter η will be described. In the first method, the parameter acquiring portion 44 calculates $m_1/((m_2)^{1/2})$ based on a whitened spectral sequence and, by referring to a plurality of different pairs of η and F(η) corresponding to η prepared in advance, obtains η corresponding to F(η) which is the closest to the calculated $m_1/((m_2)^{1/2})$.

The plurality of different pairs of η and F(η) corresponding to η prepared in advance are stored in a storage portion 441 of the parameter acquiring portion 44 in advance. The parameter acquiring portion 44 finds F(η) closest to the calculated $m_1/((m_2)^{1/2})$ by referring to the storage portion 441, and reads η corresponding to the found F(η) from the storage portion 441 and outputs it.

Here, F(η) closest to the calculated $m_1/((m_2)^{1/2})$ refers to such F(η) that an absolute value of a difference from the calculated $m_1/((m_2)^{1/2})$ is the smallest.

The second method for determining the parameter η will be described. In the second method, on the assumption that an approximate curve function of the inverse function $F^{-1}$ is, for example, $\tilde{F}^{-1}$ indicated by an expression (C3') below, the parameter acquiring portion 44 calculates $m_1/((m_2)^{1/2})$ based on a whitened spectral sequence and determines η by calculating an output value when the calculated $m_1/((m_2)^{1/2})$ is inputted to the approximate curve function $\tilde{F}^{-1}$. It is only necessary that this approximate curve function $\tilde{F}^{-1}$ is such a monotonically increasing function that an output is a positive value in a used domain.

[Expression 5]

$$\eta = \tilde{F}^{-1}\left(\frac{m_1}{\sqrt{m_2}}\right) \quad (C3')$$

$$\tilde{F}^{-1}(x) = \frac{0.2718}{0.7697 - x} - 0.1247$$

Note that η determined by the parameter acquiring portion 44 may be defined not by the expression (C3) but by an expression obtained by generalizing the expression (C3) using positive integers q1 and q2 specified in advance (q1<q2) like an expression (C3").

[Expression 6]

$$\eta = F'^{-1}\left(\frac{m_{q_1}}{(m_{q_2})^{q_1/q_2}}\right) \quad (C3'')$$

$$F'(\eta) = \frac{\Gamma((q_1+1)/\eta)}{(\Gamma(1/\eta))^{1-q_1/q_2}(\Gamma((q_2+1)/\eta))^{q_1/q_2}}$$

$$m_{q_1} = \frac{1}{N}\sum_{k=0}^{N-1}|X_W(k)|^{q_1}, \quad m_{q_2} = \frac{1}{N}\sum_{k=0}^{N-1}|X_W(k)|^{q_2}$$

In the case where η is defined by the expression (C3") also, η can be determined in a method similar to the method in the case where η is defined by the expression (C3). That is, after calculating a value $m_{q_1}/((m_{q_2})^{q_1/q_2})$ based on $m_{q_1}$ which is the q1-th order moment of a whitened spectral sequence, and $m_{q_2}$ which is the q2-th order moment of the whitened spectral sequence, based on the whitened spectral sequence, for example, the parameter acquiring portion 44 can, by referring to a plurality of different pairs of η and F'(η) corresponding to η prepared in advance, acquire η corresponding to F'(η) closest to the calculated $m_{q_1}/((m_{q_2})^{q_1/q_2})$ or can determine η by calculating, on the assumption that an approximate curve function of the inverse function $F'^{-1}$ is $\tilde{F}'^{-1}$, an output value when the calculated $m_{q_1}/((m_{q_2})^{q_1/q_2})$ is inputted to the approximate curve function $\tilde{F}'^{-1}$, similarly to the first and second methods described above.

As described above, η can be said to be a value based on two different moments $m_{q_1}$ and $m_{q_2}$ in different orders. For example, η may be determined based on a value of a ratio between a value of a moment in a lower order or a value based on the value of the moment (hereinafter referred to as the former) and a value of a moment in a higher order or a value based on the value of the moment (hereinafter referred to as the latter), or a value based on the value of the ratio, or a value obtained by dividing the former by the latter. The value based on a moment refers to, for example, $m^Q$ when the moment is indicated by m, and a predetermined real number is indicated by Q. Further, η may be determined by inputting these values to the approximate curve function $\tilde{F}'^{-1}$. It is only necessary that this approximate curve function $\tilde{F}'^{-1}$ is such a monotonically increasing function that an output is a positive value in a used domain similarly as described above.

[Encoding Apparatus and Decoding Apparatus Using Parameter Determination Device and Method, and Methods for Encoding Apparatus and Decoding Apparatus]

The parameter η determined by the parameter determination device and method can be an indicator indicating a characteristic of a time-series signal. Therefore, the parameter determination device and method can be used, for example, for an encoding process, a decoding process and voice/acoustic related techniques such as sound classification and sound section estimation.

Examples of an encoding apparatus and decoding apparatus using the parameter determination device and method, and methods for the encoding apparatus and the decoding will be described below.

(Encoding)

Figure 4:
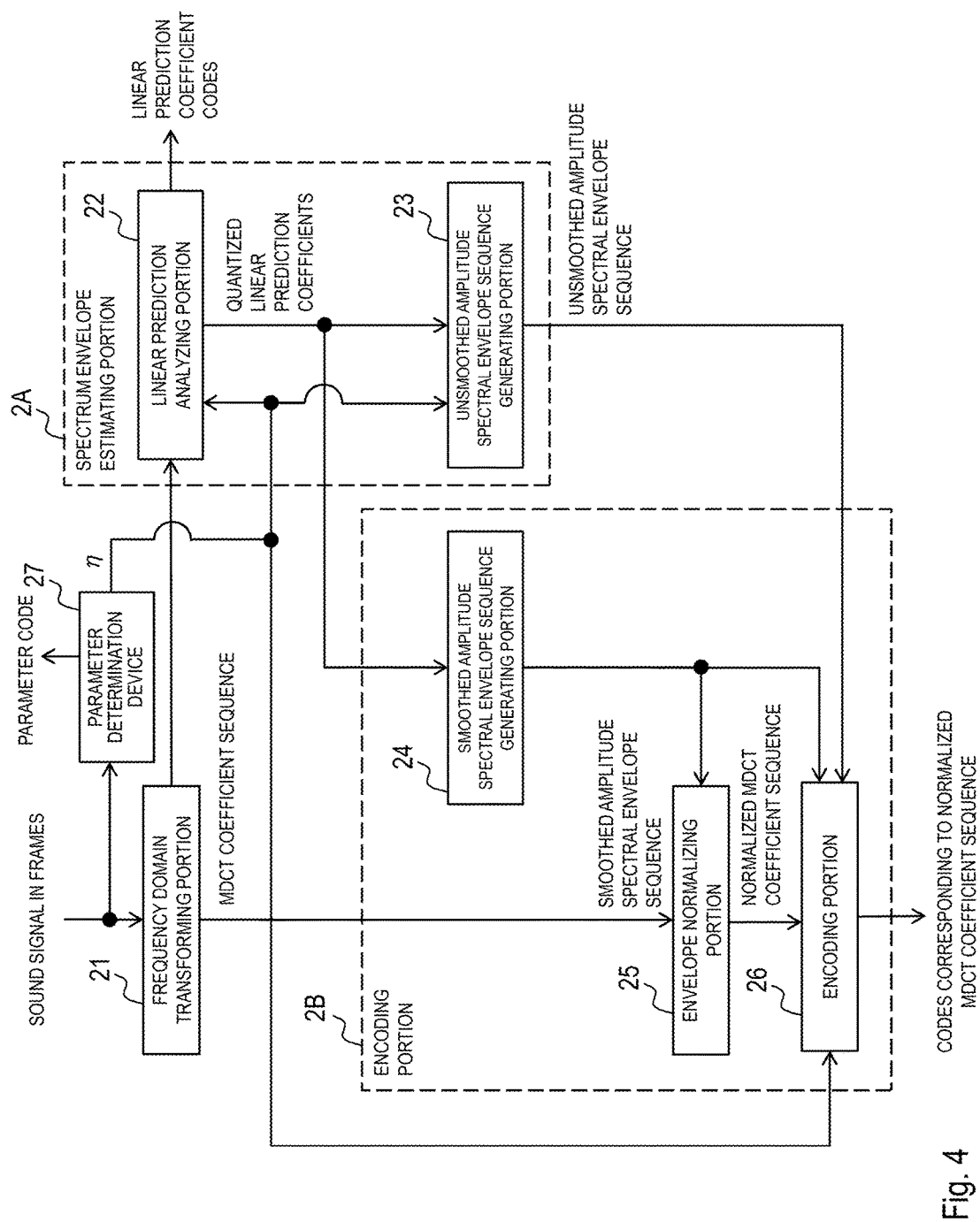
FIG. 4 is a block diagram for illustrating an example of an encoding apparatus.
Figure 5:
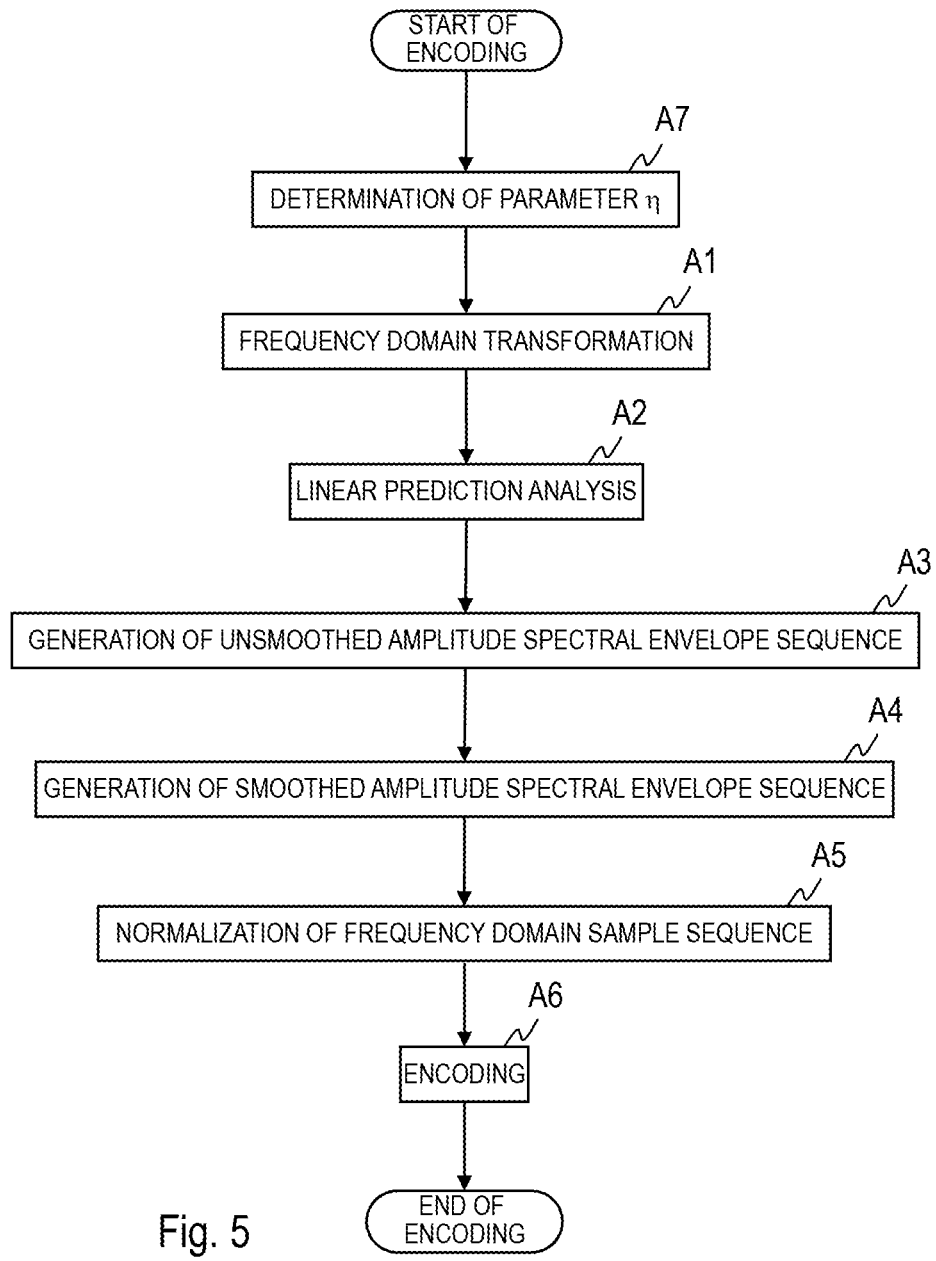
FIG. 5 is a flowchart for illustrating an example of an encoding method.

A configuration example of the encoding apparatus is shown in FIG. 4. As shown in FIG. 4, the encoding apparatus is provided with, for example, a frequency domain transforming portion 21, a linear prediction analyzing portion 22, an unsmoothed amplitude spectral envelope sequence generating portion 23, a smoothed amplitude spectral envelope sequence generating portion 24, an envelope normalizing portion 25, an encoding portion 26 and a parameter determination device 27. An example of each process of an encoding method realized by this encoding apparatus is shown in FIG. 5.

Each portion in FIG. 4 will be described below.

<Parameter Determination Device 27>

The parameter determination device 27 is the parameter determination device illustrated in FIG. 1 described above. A time domain sound signal, which is a time-series signal, is inputted to the parameter determination device 27. An example of the sound signal is a voice digital signal or an acoustic digital signal.

The parameter determination device 27 determines a parameter based on the inputted time-series signal by the process described above (step A7). The determined is outputted to the linear prediction analyzing portion 22, the unsmoothed amplitude spectral envelope sequence estimating portion 23 and the smoothed amplitude spectral envelope sequence estimating portion 24.

Further, the parameter determination device 27 generates a parameter code by encoding the determined η. The generated parameter code is transmitted to the decoding apparatus.

<Frequency Domain Transforming Portion 21>

A sound signal, which is a time-domain time-series signal, is inputted to the frequency domain transforming portion 21. An example of the sound signal is a voice digital signal or an acoustic digital signal.

The frequency domain transforming portion 21 transforms the inputted time domain sound signal to an MDCT coefficient sequence X(0), X(1), . . . , X(N−1) at a point N in a frequency domain for each frame with a predetermined time length (step A1). Here, N is a positive integer.

The obtained MDCT coefficient sequence X(0), X(1), ..., X(N−1) is outputted to the linear prediction analyzing portion 22 and the envelope normalizing portion 25.

It is assumed that subsequent processes are performed for each frame unless otherwise stated.

In this way, the frequency domain transforming portion 21 determines a frequency domain sample sequence, which is, for example, an MDCT coefficient sequence, corresponding to the sound signal.

<Linear Prediction Analyzing Portion 22>

The MDCT coefficient sequence X(0), X(1), ..., X(N−1) obtained by the frequency domain transforming portion 21 is inputted to the linear prediction analyzing portion 22.

The linear prediction analyzing portion 22 generates linear prediction coefficients $\beta_1, \beta_2, \ldots, \beta_p$ by performing linear prediction analysis of $\tilde{R}(0), \tilde{R}(1), \ldots, \tilde{R}(N-1)$ defined by the following expression (A7) using the MDCT coefficient sequence X(0), X(1), ..., X(N−1), and encodes the generated linear prediction coefficients $\beta_1, \beta_2, \ldots, \beta_p$ to generate linear prediction coefficient codes and quantized linear prediction coefficients $\hat{\beta}_1, \hat{\beta}_2, \ldots, \hat{\beta}_p$, which are quantized linear prediction coefficients corresponding to the linear prediction coefficient codes (step A2).

[Expression 7]

$$\tilde{R}(k) = \sum_{n=0}^{N-1} |X(n)|^\eta \exp\left(-j\frac{2\pi kn}{N}\right), \quad k = 0, 1, \ldots, N-1 \quad (A7)$$

The generated quantized linear prediction coefficients $\hat{\beta}_1, \hat{\beta}_2, \ldots, \hat{\beta}_p$ are outputted to the unsmoothed amplitude spectral envelope sequence generating portion 23 and the smoothed amplitude spectral envelope sequence generating portion 24. During the linear prediction analysis process, predictive residual energy $\sigma^2$ is calculated. In this case, the calculated predictive residual energy $\sigma^2$ is outputted to a variance parameter determining portion 268.

Further, the generated linear prediction coefficient codes are transmitted to the decoding apparatus.

Specifically, by performing operation corresponding to inverse Fourier transform regarding the η-th power of absolute values of the MDCT coefficient sequence X(0), X(1), ..., X(N−1) as a power spectrum, that is, the operation of the expression (A7) first, the linear prediction analyzing portion 22 determines a pseudo correlation function signal sequence $\tilde{R}(0), \tilde{R}(1), \ldots, \tilde{R}(N-1)$, which is a time domain signal sequence corresponding to the η-th power of the absolute values of the MDCT coefficient sequence X(0), X(1), ..., X(N−1). Then, the linear prediction analyzing portion 22 performs linear prediction analysis using the determined pseudo correlation function signal sequence $\tilde{R}(0), \tilde{R}(1), \ldots, \tilde{R}(N-1)$ to generate linear prediction coefficients $\beta_1, \beta_2, \ldots, \beta_p$. Then, by encoding the generated linear prediction coefficients $\beta_1, \beta_2, \ldots, \beta_p$, the linear prediction analyzing portion 22 obtains linear prediction coefficient codes and quantized linear prediction coefficients $\hat{\beta}_1, \hat{\beta}_2, \ldots, \hat{\beta}_p$ corresponding the linear prediction coefficient codes.

The linear prediction coefficients $\beta_1, \beta_2, \ldots, \beta_p$ are linear prediction coefficients corresponding to a time domain signal when the $\eta_0$-th power of the absolute values of MDCT coefficient sequence X(0), X(1), ..., X(N−1) are regarded as a power spectrum.

Generation of the linear prediction coefficient codes by the linear prediction analyzing portion 22 is performed, for example, by a conventional encoding technique. An example of the conventional encoding technique is, for example, an encoding technique in which a code corresponding to a linear prediction coefficient itself is caused to be a linear prediction coefficient code, an encoding technique in which a linear prediction coefficient is transformed to an LSP parameter, and a code corresponding to the LSP parameter is caused to be a linear prediction coefficient code, an encoding technique in which a linear prediction coefficient is transformed to a PARCOR coefficient, and a code corresponding to the PARCOR coefficient is caused to be a linear prediction code, or the like. For example, the encoding technique in which a code corresponding to a linear prediction coefficient itself is caused to be a linear prediction coefficient code is a technique in which a plurality of quantized linear prediction coefficient candidates are specified in advance; each candidates is stored being associated with a linear prediction coefficient code in advance; any of the candidates is determined as a quantized linear prediction coefficient corresponding to a generated linear prediction coefficient; and, thereby, the quantized linear prediction coefficient and the linear prediction coefficient code are obtained.

In this way, the linear prediction analyzing portion 22 performs linear prediction analysis using a pseudo correlation function signal sequence obtained by performing inverse Fourier transform regarding the η-th power of absolute values of a frequency domain sequence, which is, for example, an MDCT coefficient sequence, as a power spectrum, and generates coefficients transformable to linear prediction coefficients.

<Unsmoothed Amplitude Spectral Envelope Sequence Generating Portion 23>

The quantized linear prediction coefficients $\hat{\beta}_1, \hat{\beta}_2, \ldots, \hat{\beta}_p$ generated by the linear prediction analyzing portion 22 are inputted to the unsmoothed amplitude spectral envelope sequence generating portion 23.

The unsmoothed amplitude spectral envelope sequence generating portion 23 generates an unsmoothed amplitude spectral envelope sequence $\hat{H}(0), \hat{H}(1), \ldots, \hat{H}(N-1)$, which is an amplitude spectral envelope sequence corresponding to the quantized linear prediction coefficients $\hat{\beta}_1, \hat{\beta}_2, \ldots, \hat{\beta}_p$ (step A3).

The generated unsmoothed amplitude spectral envelope sequence $\hat{H}(0), \hat{H}(1), \ldots, \hat{H}(N-1)$ is outputted to the encoding portion 26.

The unsmoothed amplitude spectral envelope sequence generating portion 23 generates an unsmoothed amplitude spectral envelope sequence $\hat{H}(0), \hat{H}(1), \ldots, \hat{H}(N-1)$ defined by the following expression (A2) as the unsmoothed amplitude spectral envelope sequence $\hat{H}(0), \hat{H}(1), \ldots, \hat{H}(N-1)$ using the quantized linear prediction coefficients $\hat{\beta}_1, \hat{\beta}_2, \ldots, \hat{\beta}_p$.

[Expression 8]

$$\hat{H}(k) = \left(\frac{1}{2\pi} \frac{1}{\left|1 + \sum_{n=1}^{p} \hat{\beta}_n \exp(-j2\pi kn/N)\right|^2}\right)^{1/\eta} \quad (A2)$$

In this way, the unsmoothed amplitude spectral envelope sequence generating portion 23 performs estimation of a spectral envelope by obtaining an unsmoothed spectral envelope sequence, which is a sequence obtained by raising a sequence of an amplitude spectral envelope corresponding to coefficients transformable to linear prediction coefficients generated by the linear prediction analyzing portion 22 to the power of 1/η. Here, when it is assumed that c is an arbitrary number, a sequence obtained by raising a sequence constituted by a plurality of values to the power of c refers to a sequence constituted by values obtained by raising the plurality of values to the power of c, respectively. For example, a sequence obtained by raising a sequence of an amplitude spectral envelope to the power of 1/η refers to a sequence constituted by values obtained by raising coefficients of the amplitude spectral envelope to the power of 1/η, respectively.

The process of raise to the power of 1/η by the unsmoothed amplitude spectral envelope sequence generating portion 23 is due to the process performed by the linear prediction analyzing portion 22 in which the η-th power of absolute values of a frequency domain sample sequence are regarded as a power spectrum. That is, the process of raise to the power of 1/η by the unsmoothed amplitude spectral envelope sequence generating portion 23 is performed in order to return values raised to the power of η by the process performed by the linear prediction analyzing portion 22 in which the η-th power of absolute values of a frequency domain sample sequence are regarded as a power spectrum, to the original values.

<Smoothed Amplitude Spectral Envelope Sequence Generating Portion 24>

The quantized linear prediction coefficients $\hat{\beta}_1$, $\hat{\beta}_2$, ..., $\hat{\beta}_p$ generated by the linear prediction analyzing portion 22 are inputted to the smoothed amplitude spectral envelope sequence generating portion 24.

The smoothed amplitude spectral envelope sequence generating portion 24 generates a smoothed amplitude spectral envelope sequence $\hat{H}_\gamma(0)$, $\hat{H}_\gamma(1)$, ..., $\hat{H}_\gamma(N-1)$, which is a sequence obtained by reducing amplitude unevenness of a sequence of an amplitude spectral envelope corresponding to the quantized linear prediction coefficients $\hat{\beta}_1$, $\hat{\beta}_2$, ..., $\hat{\beta}_p$ (step A4).

The generated smoothed amplitude spectral envelope sequence $\hat{H}_\gamma(0)$, $\hat{H}_\gamma(1)$, ..., $\hat{H}_\gamma(N-1)$ is outputted to the envelope normalizing portion 25 and the encoding portion 26.

The smoothed amplitude spectral envelope sequence generating portion 24 generates a smoothed amplitude spectral envelope sequence $\hat{H}_\gamma(0)$, $\hat{H}_\gamma(1)$, ..., $\hat{H}_\gamma(N-1)$ defined by an expression (A3) as the smoothed amplitude spectral envelope sequence $\hat{H}_\gamma(0)$, $\hat{H}_\gamma(1)$, ..., $\hat{H}_\gamma(N-1)$ using the quantized linear prediction coefficients $\hat{\beta}_1$, $\hat{\beta}_2$, ..., $\hat{\beta}_p$ and a correction coefficient γ.

[Expression 9]

$$\hat{H}_\gamma(k) = \left( \frac{1}{2\pi} \frac{1}{\left|1 + \sum_{n=1}^{p} \hat{\beta}_n \gamma^n \exp(-j2\pi kn/N)\right|^2} \right)^{1/\eta} \quad (A3)$$

Here, the correction coefficient γ is a constant smaller than 1 specified in advance and a coefficient that reduces amplitude unevenness of the unsmoothed amplitude spectral envelope sequence $\hat{H}(0)$, $\hat{H}(1)$, ..., $\hat{H}(N-1)$, in other words, a coefficient that smoothes the unsmoothed amplitude spectral envelope sequence $\hat{H}(0)$, $\hat{H}(1)$, ..., $\hat{H}(N-1)$.

<Envelope Normalizing Portion 25>

The MDCT coefficient sequence $X(0)$, $X(1)$, ..., $X(N-1)$ obtained by the frequency domain transforming portion 21 and the smoothed amplitude spectral envelope sequence $\hat{H}_\gamma(0)$, $\hat{H}_\gamma(1)$, ..., $\hat{H}_\gamma(N-1)$ generated by the smoothed amplitude spectral envelope generating portion 24 are inputted to the envelope normalizing portion 25.

The envelope normalizing portion 25 generates a normalized MDCT coefficient sequence $X_N(0)$, $X_N(1)$, ..., $X_N(N-1)$ by normalizing each coefficient of the MDCT coefficient sequence $X(0)$, $X(1)$, ..., $X(N-1)$ by a corresponding value of the smoothed amplitude spectral envelope sequence $\hat{H}_\gamma(0)$, $\hat{H}_\gamma(1)$, ..., $\hat{H}_\gamma(N-1)$ (step A5).

The generated normalized MDCT coefficient sequence is outputted to the encoding portion 26.

The envelope normalizing portion 25 generates each coefficient $X_N(k)$ of the normalized MDCT coefficient sequence $X_N(0)$, $X_N(1)$, ..., $X_N(N-1)$ by dividing each coefficient $X(k)$ of the MDCT coefficient sequence $X(0)$, $X(1)$, ..., $X(N-1)$ by a corresponding value of the smoothed amplitude spectral envelope sequence $\hat{H}_\gamma(0)$, $\hat{H}_\gamma(1)$, ..., $\hat{H}_\gamma(N-1)$, for example, on the assumption of $k=0, 1, ..., N-1$. That is, $X_N(k)=X(k)/\hat{H}_\gamma(k)$ is satisfied on the assumption of $k=0, 1, ..., N-1$.

<Encoding Portion 26>

The normalized MDCT coefficient sequence $X_N(0)$, $X_N(1)$, ..., $X_N(N-1)$ generated by the envelope normalizing portion 25, the unsmoothed amplitude spectral envelope sequence $\hat{H}(0)$, $\hat{H}(1)$, ..., $\hat{H}(N-1)$ generated by the unsmoothed amplitude spectral envelope generating portion 23, the smoothed amplitude spectral envelope sequence $\hat{H}_\gamma(0)$, $\hat{H}_\gamma(1)$, ..., $\hat{H}_\gamma(N-1)$ generated by the smoothed amplitude spectral envelope generating portion 24 and average residual energy $\sigma^2$ calculated by the linear prediction analyzing portion 22 are inputted to the encoding portion 26.

Figure 6:
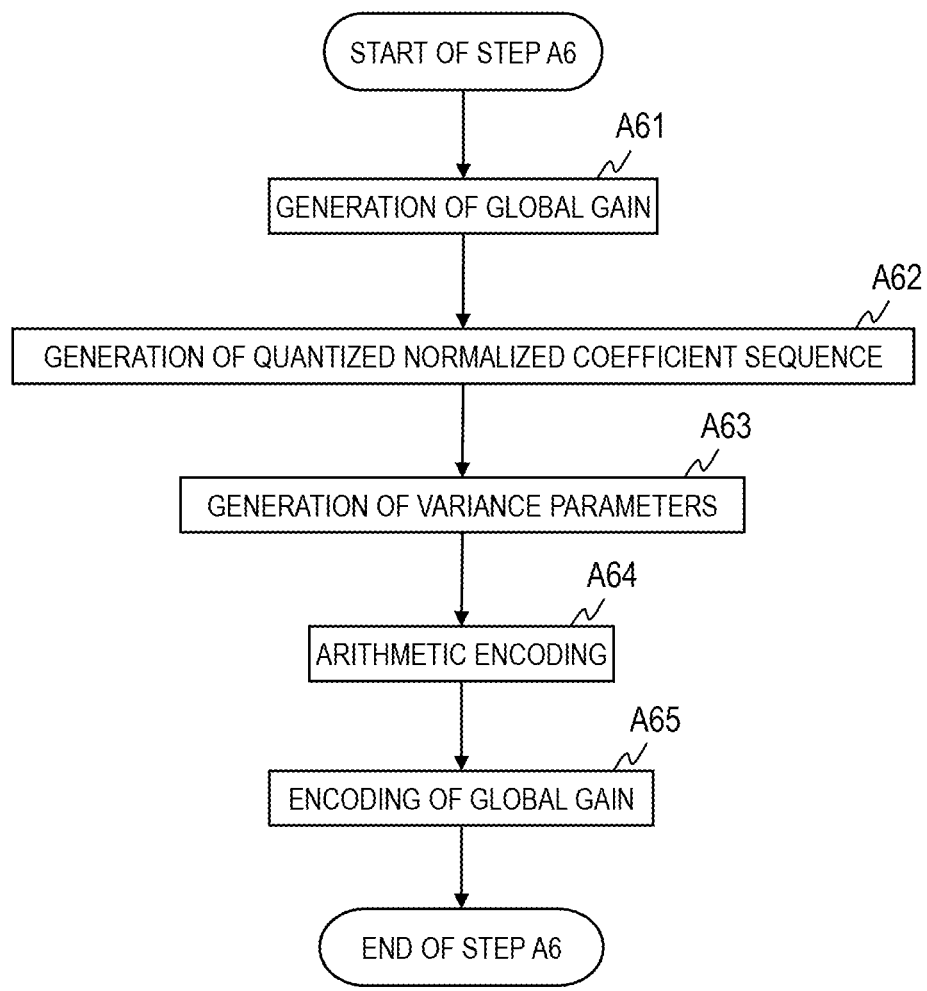
FIG. 6 is a flowchart for illustrating an example of a process of an encoding portion.

The encoding portion 26 performs encoding, for example, by performing processes of steps A61 to A65 shown in FIG. 6 (step A6).

The encoding portion 26 determines a global gain g corresponding to the normalized MDCT coefficient sequence $X_N(0)$, $X_N(1)$, ..., $X_N(N-1)$ (step A61), determines a quantized normalized coefficient sequence $X_Q(0)$, $X_Q(1)$, ..., $X_Q(N-1)$, which is a sequence of integer values obtained by quantizing a result of dividing each coefficient of the normalized MDCT coefficient sequence $X_N(0)$, $X_N(1)$, ..., $X_N(N-1)$ by the global gain g (step A62), determines variance parameters $\varphi(0)$, $\varphi(1)$, ..., $\varphi(N-1)$ corresponding to coefficients of the quantized normalized coefficient sequence $X_Q(0)$, $X_Q(1)$, ..., $X_Q(N-1)$, respectively, from the global gain g, the unsmoothed amplitude spectral envelope sequence $\hat{H}(0)$, $\hat{H}(1)$, ..., $\hat{H}(N-1)$, the smoothed amplitude spectral envelope sequence $\hat{H}_\gamma(0)$, $\hat{H}_\gamma(1)$, ..., $\hat{H}_\gamma(N-1)$ and the average residual energy $\sigma^2$ by an expression (A1) (step A63), performs arithmetic encoding of the quantized normalized coefficient sequence $X_Q(0)$, $X_Q(1)$, ..., $X_Q(N-1)$ using the variance parameters $\varphi(0)$, $\varphi(1)$, ..., $\varphi(N-1)$ to obtain integer signal codes (step A64) and obtains a gain code corresponding to the global gain g (step A65).

[Expression 10]

$$\phi(k) = \eta^{1/\eta} B(\eta) \hat{H}_N(k) \frac{\sigma^{2/\eta}}{g} \quad (A1)$$

Here, a normalized amplitude spectral envelope sequence $\hat{H}_N(0)$, $\hat{H}_N(1)$, ..., $\hat{H}_N$ in the above expression (A1) is what is obtained by dividing each value of the unsmoothed amplitude spectral envelope sequence ^H(0), ^H(1), ..., ^H(N−1) by a corresponding value of the smoothed amplitude spectral envelope sequence ^H$_\gamma$(0), ^H$_\gamma$(1), ..., ^H$_\gamma$(N−1), that is, what is determined by the following expression (A8).

[Expression 11]

$$\hat{H}_N(k) = \frac{\hat{H}(k)}{\hat{H}_\gamma(k)}, \quad k = 0, 1, \ldots, N-1 \qquad (A8)$$

The generated integer signal codes and gain code are outputted to the decoding apparatus as codes corresponding to the normalized MDCT coefficient sequence.

The encoding portion 26 realizes a function of determining such a global gain g that the number of bits of the integer signal codes is equal to or smaller than the number of allocated bits B, which is the number of bits allocated in advance, and is as large as possible and generating a gain code corresponding to the determined global gain g and integer signal codes corresponding to the determined global gain g by the above steps A61 to A65.

Among steps A61 to A65 performed by the encoding portion 26, it is step A63 that comprises a characteristic process. As for the encoding process itself which is for obtaining the codes corresponding to the normalized MDCT coefficient sequence by encoding each of the global gain g and the quantized normalized coefficient sequence $X_Q(0)$, $X_Q(1)$, ..., $X_Q(N−1)$, various publicly-known techniques including the technique described in Non-patent literature 1 exist. Two specific examples of the encoding process performed by the encoding portion 26 will be described below.

[Specific Example 1 of Encoding Process Performed by Encoding Portion 26]

As a specific example 1 of the encoding process performed by the encoding portion 26, an example which does not comprise a loop process will be described.

Figure 7:
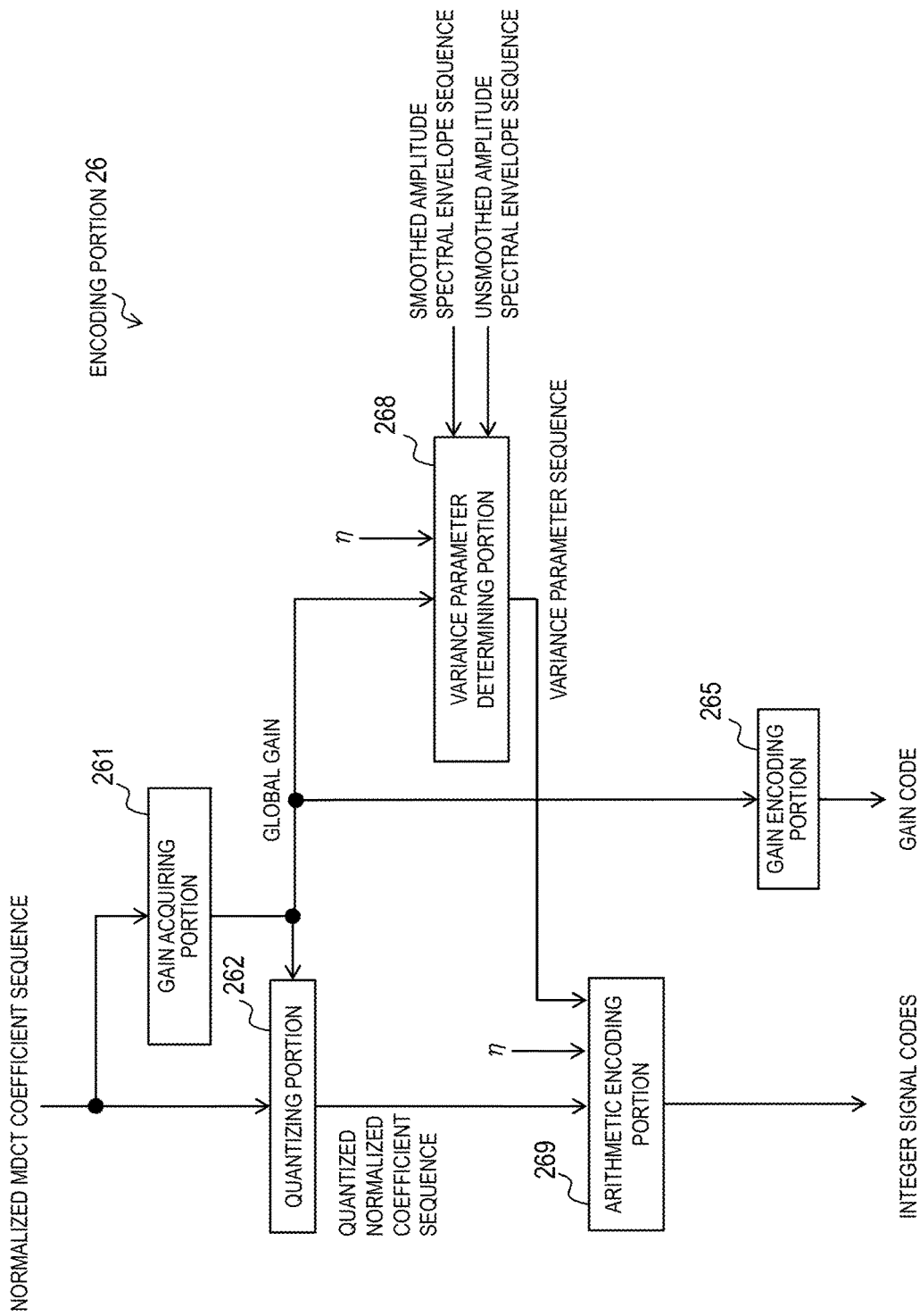
FIG. 7 is a block diagram for illustrating an example of the encoding portion.

FIG. 7 shows a configuration example of the encoding portion 26 of the specific example 1. As shown in FIG. 7, the encoding portion 26 of the specific example 1 is, for example, provided with a gain acquiring portion 261, a quantizing portion 262, a variance parameter determining portion 268, an arithmetic encoding portion 269 and a gain encoding portion 265. Each portion in FIG. 7 will be described below.

<Gain Acquiring Portion 261>

The normalized MDCT coefficient sequence $X_N(0)$, $X_N(1)$, ..., $X_N(N−1)$ generated by the envelope normalizing portion 25 is inputted to the gain acquiring portion 261.

The gain acquiring portion 261 determines and outputs such a global gain g that the number of bits of integer signal codes is equal to or smaller than the number of allocated bits B, which is the number of bits allocated in advance, and is as large as possible, from the normalized MDCT coefficient sequence $X_N(0)$, $X_N(1)$, ..., $X_N(N−1)$ (step S261). For example, the gain acquiring portion 261 acquires and outputs a value of multiplication of a square root of the total of energy of the normalized MDCT coefficient sequence $X_N(0)$, $X_N(1)$, ..., $X_N(N−1)$ by a constant which is in negative correlation with the number of allocated bits B as the global gain g. Otherwise, the gain acquiring portion 261 may tabulate a relationship among the total of energy of the normalized MDCT coefficient sequence $X_N(0)$, $X_N(1)$, ..., $X_N(N−1)$, the number of allocated bits B and the global gain g in advance, and obtain and output a global gain g by referring to the table.

In this way, the gain acquiring portion 261 obtains a gain for performing division of all samples of a normalized frequency domain sample sequence which is, for example, a normalized MDCT coefficient sequence.

The obtained global gain g is outputted to the quantizing portion 262 and the variance parameter determining portion 268.

<Quantizing Portion 262>

The normalized MDCT coefficient sequence $X_N(0)$, $X_N(1)$, ..., $X_N(N−1)$ generated by the envelope normalizing portion 25 and the global gain g obtained by the gain acquiring portion 261 are inputted to the quantizing portion 262.

The quantizing portion 262 obtains and outputs a quantized normalized coefficient sequence $X_Q(0)$, $X_Q(1)$, ..., $X_Q(N−1)$, which is a sequence of integer parts of a result of dividing each coefficient of the normalized MDCT coefficient sequence $X_N(0)$, $X_N(1)$, ..., $X_N(N−1)$ by the global gain g (step S262).

In this way, the quantizing portion 262 determines a quantized normalized coefficient sequence by dividing each sample of a normalized frequency domain sample sequence which is, for example, a normalized MDCT coefficient sequence by a gain and quantizing the result.

The obtained quantized normalized coefficient sequence $X_Q(0)$, $X_Q(1)$, ..., $X_Q(N−1)$ is outputted to the arithmetic encoding portion 269.

<Variance Parameter Determining Portion 268>

The global gain g obtained by the gain acquiring portion 261, the unsmoothed amplitude spectral envelope sequence ^H(0), ^H(1), ..., ^H(N−1) generated by the unsmoothed amplitude spectral envelope generating portion 23, the smoothed amplitude spectral envelope sequence ^H$_\gamma$(0), ^H$_\gamma$(1), ..., ^H$_\gamma$(N−1) generated by the smoothed amplitude spectral envelope generating portion 24, and the predictive residual energy $\sigma^2$ obtained by the linear prediction analyzing portion 22 are inputted to the variance parameter determining portion 268.

The variance parameter determining portion 268 obtains and outputs each variance parameter of a variance parameter sequence $\varphi(0)$, $\varphi(1)$, ..., $\varphi(N−1)$ from the global gain g, the unsmoothed amplitude spectral envelope sequence ^H(0), ^H(1), ..., ^H(N−1), the smoothed amplitude spectral envelope sequence ^H$_\gamma$(0), ^H$_\gamma$(1), ..., ^H$_\gamma$(N−1) and the predictive residual energy $\sigma^2$ by the above expressions (A1) and (A8) (step S268).

The obtained variance parameter sequence $\varphi(0)$, $\varphi(1)$, ..., $\varphi(N−1)$ is outputted to the arithmetic encoding portion 269.

<Arithmetic Encoding Portion 269>

The quantized normalized coefficient sequence $X_Q(0)$, $X_Q(1)$, ..., $X_Q(N−1)$ obtained by the quantizing portion 262 and the variance parameter sequence $\varphi(0)$, $\varphi(1)$, ..., $\varphi(N−1)$ obtained by the variance parameter determining portion 268 are inputted to the arithmetic encoding portion 269.

The arithmetic encoding portion 269 performs arithmetic encoding of the quantized normalized coefficient sequence $X_Q(0)$, $X_Q(1)$, ..., $X_Q(N−1)$ using each variance parameter of the variance parameter sequence $\varphi(0)$, $\varphi(1)$, ..., $\varphi(N−1)$ as a variance parameter corresponding to each coefficient of the quantized normalized coefficient sequence $X_Q(0)$, $X_Q(1)$, ..., $X_Q(N−1)$ to obtain and output integer signal codes (step S269).

At the time of performing arithmetic encoding, the arithmetic encoding portion 269 configures such arithmetic codes that each coefficient of the quantized normalized coefficient sequence $X_Q(0)$, $X_Q(1)$, ..., $X_Q(N-1)$ becomes optimal when being in accordance with generalized Gaussian distribution $f_{GG}(X|\varphi(k), \eta)$ and performs encoding with the arithmetic codes based on this configuration. As a result, an expected value of bit allocation to each coefficient of the quantized normalized coefficient sequence $X_Q(0)$, $X_Q(1)$, ..., $X_Q(N-1)$ is determined with the variance parameter sequence $\varphi(0)$, $\varphi(1)$, ..., $\varphi(N-1)$.

The obtained integer signal codes are outputted to the decoding apparatus.

Arithmetic encoding may be performed over a plurality of coefficients in the quantized normalized coefficient sequence $X_Q(0)$, $X_Q(1)$, ..., $X_Q(N-1)$. In this case, since each variance parameter of the variance parameter sequence $\varphi(0)$, $\varphi(1)$, ..., $\varphi(N-1)$ is based on the unsmoothed amplitude spectral envelope sequence $\hat{H}(0)$, $\hat{H}(1)$, ..., $\hat{H}(N-1)$ as seen from the expressions (A1) and (A8), it can be said that the arithmetic encoding portion 269 performs such encoding that bit allocation substantially changes based on an estimated spectral envelope (an unsmoothed amplitude spectral envelope).

<Gain Encoding Portion 265>

The global gain g obtained by the gain acquiring portion 261 is inputted to the gain encoding portion 265.

The gain encoding portion 265 encodes the global gain g to obtain and output a gain code (step S265).

The generated integer signal codes and gain code are outputted to the decoding apparatus as codes corresponding to the normalized MDCT coefficient sequence.

Steps S261, S262, S268, S269 and S265 of the present specific example 1 correspond to the above steps A61, A62, A63, A64 and A65, respectively.

[Specific Example 2 of Encoding Process Performed by Encoding Portion 26]

As a specific example 2 of the encoding process performed by the encoding portion 26, an example which comprises a loop process will be described.

Figure 8:
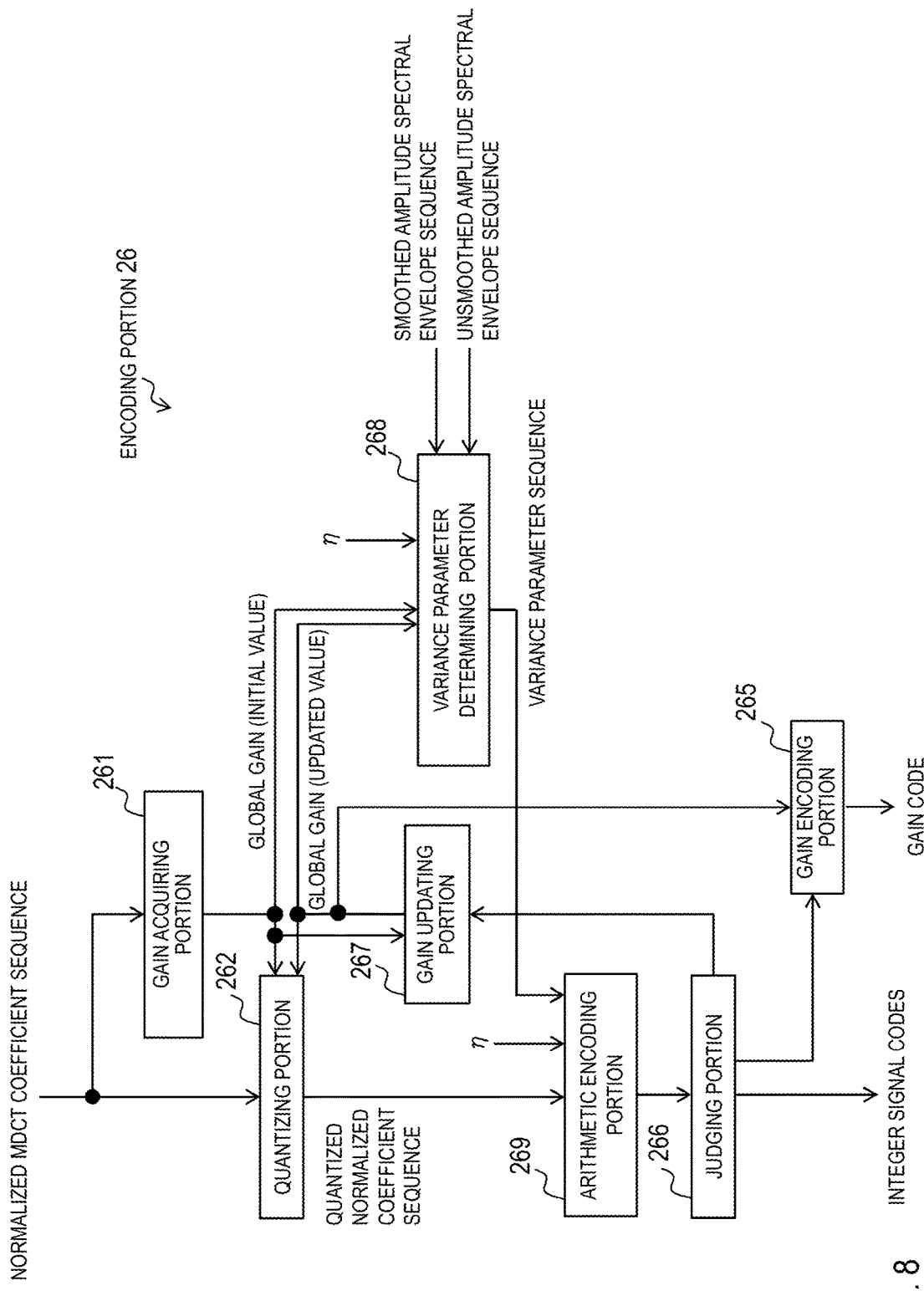
FIG. 8 is a block diagram for illustrating an example of the encoding portion.

FIG. 8 shows a configuration example of the encoding portion 26 of the specific example 2. As shown in FIG. 8, the encoding portion 26 of the specific example 2 is, for example, provided with a gain acquiring portion 261, a quantizing portion 262, a variance parameter determining portion 268, an arithmetic encoding portion 269, a gain encoding portion 265, a judging portion 266 and a gain updating portion 267. Each portion in FIG. 8 will be described below.

<Gain Acquiring Portion 261>

The normalized MDCT coefficient sequence $X_N(0)$, $X_N(1)$, ..., $X_N(N-1)$ generated by the envelope normalizing portion 25 is inputted to the gain acquiring portion 261.

The gain acquiring portion 261 determines and outputs such a global gain g that the number of bits of integer signal codes is equal to or smaller than the number of allocated bits B, which is the number of bits allocated in advance, and is as large as possible, from the normalized MDCT coefficient sequence $X_N(0)$, $X_N(1)$, ..., $X_N(N-1)$ (step S261). For example, the gain acquiring portion 261 acquires and outputs a value of multiplication of a square root of the total of energy of the normalized MDCT coefficient sequence $X_N(0)$, $X_N(1)$, ..., $X_N(N-1)$ by a constant which is in negative correlation with the number of allocated bits B as the global gain g.

The obtained global gain g is outputted to the quantizing portion 262 and the variance parameter determining portion 268.

The global gain g obtained by the gain acquiring portion 261 becomes an initial value of a global gain used by the quantizing portion 262 and the variance parameter determining portion 268.

<Quantizing Portion 262>

The normalized MDCT coefficient sequence $X_N(0)$, $X_N(1)$, ..., $X_N(N-1)$ generated by the envelope normalizing portion 25 and the global gain g obtained by the gain acquiring portion 261 or the gain updating portion 267 are inputted to the quantizing portion 262.

The quantizing portion 262 obtains and outputs a quantized normalized coefficient sequence $X_Q(0)$, $X_Q(1)$, ..., $X_Q(N-1)$, which is a sequence of integer parts of a result of dividing each coefficient of the normalized MDCT coefficient sequence $X_N(0)$, $X_N(1)$, ..., $X_N(N-1)$ by the global gain g (step S262).

Here, a global gain g used when the quantizing portion 262 is executed for the first time is the global gain g obtained by the gain acquiring portion 261, that is, the initial value of the global gain. Further, a global gain g used when the quantizing portion 262 is executed at and after the second time is the global gain g obtained by the gain updating portion 267, that is, an updated value of the global gain.

The obtained quantized normalized coefficient sequence $X_Q(0)$, $X_Q(1)$, ..., $X_Q(N-1)$ is outputted to the arithmetic encoding portion 269.

<Variance Parameter Determining Portion 268>

The global gain g obtained by the gain acquiring portion 261 or the gain updating portion 267, the unsmoothed amplitude spectral envelope sequence $\hat{H}(0)$, $\hat{H}(1)$, ..., $\hat{H}(N-1)$ generated by the unsmoothed amplitude spectral envelope generating portion 23, the smoothed amplitude spectral envelope sequence $\hat{H}_\gamma(0)$, $\hat{H}_\gamma(1)$, ..., $\hat{H}_\gamma(N-1)$ generated by the smoothed amplitude spectral envelope generating portion 24, and the predictive residual energy $\sigma^2$ obtained by the linear prediction analyzing portion 22 are inputted to the variance parameter determining portion 268.

The variance parameter determining portion 268 obtains each variance parameter of a variance parameter sequence $\varphi(0)$, $\varphi(1)$, ..., $\varphi(N-1)$ from the global gain g, the unsmoothed amplitude spectral envelope sequence $\hat{H}(0)$, $\hat{H}(1)$, ..., $\hat{H}(N-1)$, the smoothed amplitude spectral envelope sequence $\hat{H}_\gamma(0)$, $\hat{H}_\gamma(1)$, ..., $\hat{H}_\gamma(N-1)$ and the predictive residual energy $\sigma^2$ by the above expressions (A1) and (A8) (step S268).

Here, a global gain g used when the variance parameter determining portion 268 is executed for the first time is the global gain g obtained by the gain acquiring portion 261, that is, the initial value of the global gain. Further, a global gain g used when the variance parameter determining portion 268 is executed at and after the second time is the global gain g obtained by the gain updating portion 267, that is, an updated value of the global gain.

The obtained variance parameter sequence $\varphi(0)$, $\varphi(1)$, ..., $\varphi(N-1)$ is outputted to the arithmetic encoding portion 269.

<Arithmetic Encoding Portion 269>

The quantized normalized coefficient sequence $X_Q(0)$, $X_Q(1)$, ..., $X_Q(N-1)$ obtained by the quantizing portion 262 and the variance parameter sequence $\varphi(0)$, $\varphi(1)$, ..., $\varphi(N-1)$ obtained by the variance parameter determining portion 268 are inputted to the arithmetic encoding portion 269.

The arithmetic encoding portion 269 performs arithmetic encoding of the quantized normalized coefficient sequence $X_Q(0), X_Q(1), \ldots, X_Q(N-1)$ using each variance parameter of the variance parameter sequence $\varphi(0), \varphi(1), \ldots, \varphi(N-1)$ as a variance parameter corresponding to each coefficient of the quantized normalized coefficient sequence $X_Q(0), X_Q(1), \ldots, X_Q(N-1)$ to obtain and output integer signal codes and the number of consumed bits C, which is the number of bits of the integer signal codes (step S269).

At the time of performing arithmetic encoding, the arithmetic encoding portion 269 performs such bit allocation that each coefficient of the quantized normalized coefficient sequence $X_Q(0), X_Q(1), \ldots, X_Q(N-1)$ becomes optimal when being in accordance with the generalized Gaussian distribution $f_{GG}(X|\varphi(k), \eta)$, by arithmetic encoding, and performs encoding with arithmetic codes based on the performed bit allocation.

The obtained integer signal codes and the number of consumed bits C are outputted to the judging portion 266.

Arithmetic encoding may be performed over a plurality of coefficients in the quantized normalized coefficient sequence $X_Q(0), X_Q(1), \ldots, X_Q(N-1)$. In this case, since each variance parameter of the variance parameter sequence $\varphi(0), \varphi(1), \ldots, \varphi(N-1)$ is based on the unsmoothed amplitude spectral envelope sequence $\hat{H}(0), \hat{H}(1), \ldots, \hat{H}(N-1)$ as seen from the expressions (A1) and (A8), it can be said that the arithmetic encoding portion 269 performs such encoding that bit allocation substantially changes based on an estimated spectral envelope (an unsmoothed amplitude spectral envelope).

<Judging Portion 266>

The integer signal codes obtained by the arithmetic encoding portion 269 are inputted to the judging portion 266.

When the number of times of updating the gain is a predetermined number of times, the judging portion 266 outputs the integer signal codes as well as outputting an instruction signal to encode the global gain g obtained by the gain updating portion 267 to the gain encoding portion 265. When the number of times of updating the gain is smaller than the predetermined number of times, the judging portion 266 outputs the number of consumed bits C measured by the arithmetic encoding portion 264 to the gain updating portion 267 (step S266).

<Gain Updating Portion 267>

The number of consumed bits C measured by the arithmetic encoding portion 269 is inputted to the gain updating portion 267.

When the number of consumed bits C is larger than the number of allocated bits B, the gain updating portion 267 updates the value of the global gain g to be a larger value and outputs the value. When the number of consumed bits C is smaller than the number of allocated bits B, the gain updating portion 267 updates the value of the global gain g to be a smaller value and outputs the updated value of the global gain g (step S267).

The updated global gain g obtained by the gain updating portion 267 is outputted to the quantizing portion 262 and the gain encoding portion 265.

<Gain Encoding Portion 265>

An output instruction from the judging portion 266 and the global gain g obtained by the gain updating portion 267 are inputted to the gain encoding portion 265.

The gain encoding portion 265 encodes the global gain g to obtain and output a gain code in accordance with an instruction signal (step S265).

The integer signal codes outputted by the judging portion 266 and the gain code outputted by the gain encoding portion 265 are outputted to the decoding apparatus as codes corresponding to the normalized MDCT coefficient sequence.

That is, in the present specific example 2, step S267 performed last corresponds to the above step A61, and steps S262, S263, S264 and S265 correspond to the above steps A62, A63, A64, and A65, respectively.

The specific example 2 of the encoding process performed by the encoding portion 26 is described in more detail in International Publication No. WO2014/054556 and the like.

[Modification of Encoding Portion 26]

The encoding portion 26 may perform such encoding that bit allocation is changed based on an estimated spectral envelope (an unsmoothed amplitude spectral envelope), for example, by performing the following process.

The encoding portion 26 determines a global gain g corresponding to the normalized MDCT coefficient sequence $X_N(0), X_N(1), \ldots, X_N(N-1)$ first, and determines a quantized normalized coefficient sequence $X_Q(0), X_Q(1), \ldots, X_Q(N-1)$, which is a sequence of integer values obtained by quantizing a result of dividing each coefficient of the normalized MDCT coefficient sequence $X_N(0), X_N(1), \ldots, X_N(N-1)$ by the global gain g.

As for quantized bits corresponding to each coefficient of this quantized normalized coefficient sequence $X_Q(0), X_Q(1), \ldots, X_Q(N-1)$, it is possible to, on the assumption that distribution of $X_Q(k)$ is uniform in a certain range, determine the range based on estimated values of an envelope. Though it is also possible to encode an envelope estimation value for each of a plurality of samples, the encoding portion 26 can determine the range of $X_Q(k)$ using values $\hat{H}_N(k)$ of a normalized amplitude spectral envelope sequence based on linear prediction, for example, like the following expression (A9).

[Expression 12]

$$\phi(k) = \frac{\hat{H}(k)}{\hat{H}_\gamma(k)} = \hat{H}_N(k), \quad (k = 0, \ldots, N-1) \tag{A9}$$

In order to minimize a square error of $X_Q(k)$ at the time of quantizing $X_Q(k)$ for a certain k, it is possible to set the number of bits b(k) to be allocated, under the restriction of the following expression:

[Expression 13]

$$B = \sum_{j=0}^{j=N-1} \phi(j)$$

The number of bits b(k) to be allocated can be represented by the following expression (A10):

[Expression 14]

$$b(k) = \frac{B}{N} + \frac{1}{2}\log_2(\phi(k)^2) - \frac{1}{2}\sum_{j=0}^{j=N-1} \log_2(\phi(j)^2), \tag{A10}$$
$$(k = 0, \ldots, N-1)$$

Here, B is a positive integer specified in advance. At this time, the encoding portion 26 may perform a process for readjustment of b(k) by performing rounding off so that b(k) becomes an integer, setting b(k)=0 when b(k) is smaller than 0, or the like.

Further, it is also possible to for the encoding portion 26 to determine the number of allocated bits not for allocation for each sample but for allocation for a plurality of collected samples and, as for quantization, perform not scalar quantization for each sample but quantization for each vector of a plurality of collected samples.

When the number of quantized bits b(k) of $X_Q(k)$ of a sample k is given as described above, and encoding is performed for each sample, $X_Q(k)$ can take $2^{b(k)}$ kinds of integers from $-2^{b(k)-1}$ to $2^{b(k)-1}$. The encoding portion 26 encodes each sample with b(k) bits to obtain an integer signal code.

Generated integer signal codes are outputted to the decoding apparatus. For example, the generated b(k)-bit integer signal codes corresponding to $X_Q(k)$ are sequentially outputted to the decoding apparatus, with k=0 first.

If $X_Q(k)$ exceeds the range from $-2^{b(k)-1}$ to $2^{b(k)-1}$ described above, it is replaced with a maximum value or a minimum value.

When g is too small, quantization distortion is caused by the replacement. When g is too large, a quantization error increases, and it is not possible to effectively utilize information because the range that $X_Q(k)$ can take is too small in comparison with b(k). Therefore, optimization of g may be performed.

The encoding portion 26 encodes the global gain g to obtain and output a gain code.

The encoding portion 26 may perform encoding other than arithmetic encoding as done in this modification of the encoding portion 26.

(Decoding)

Figure 9:
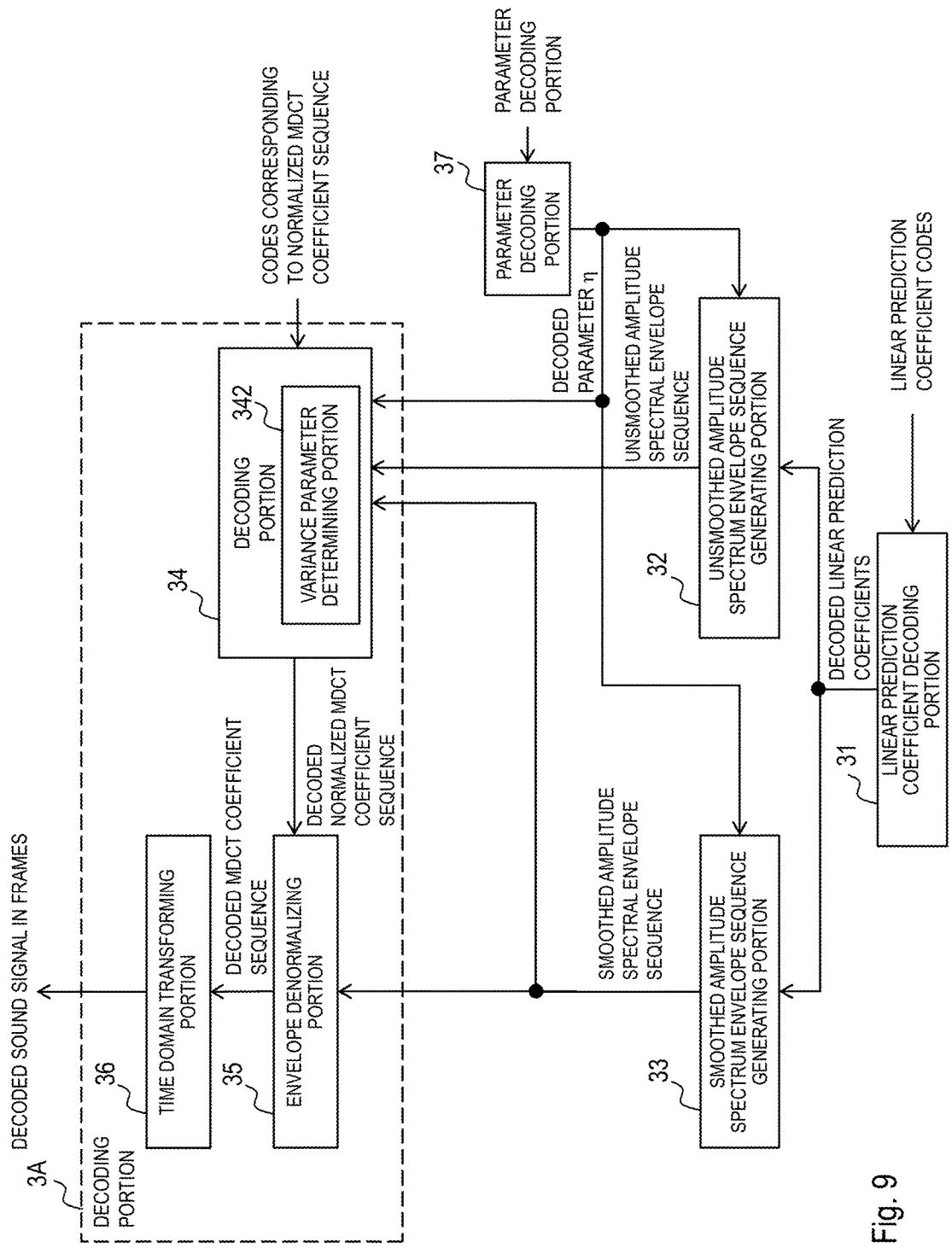
FIG. 9 is a block diagram for illustrating an example of a decoding apparatus of the present invention.
Figure 10:
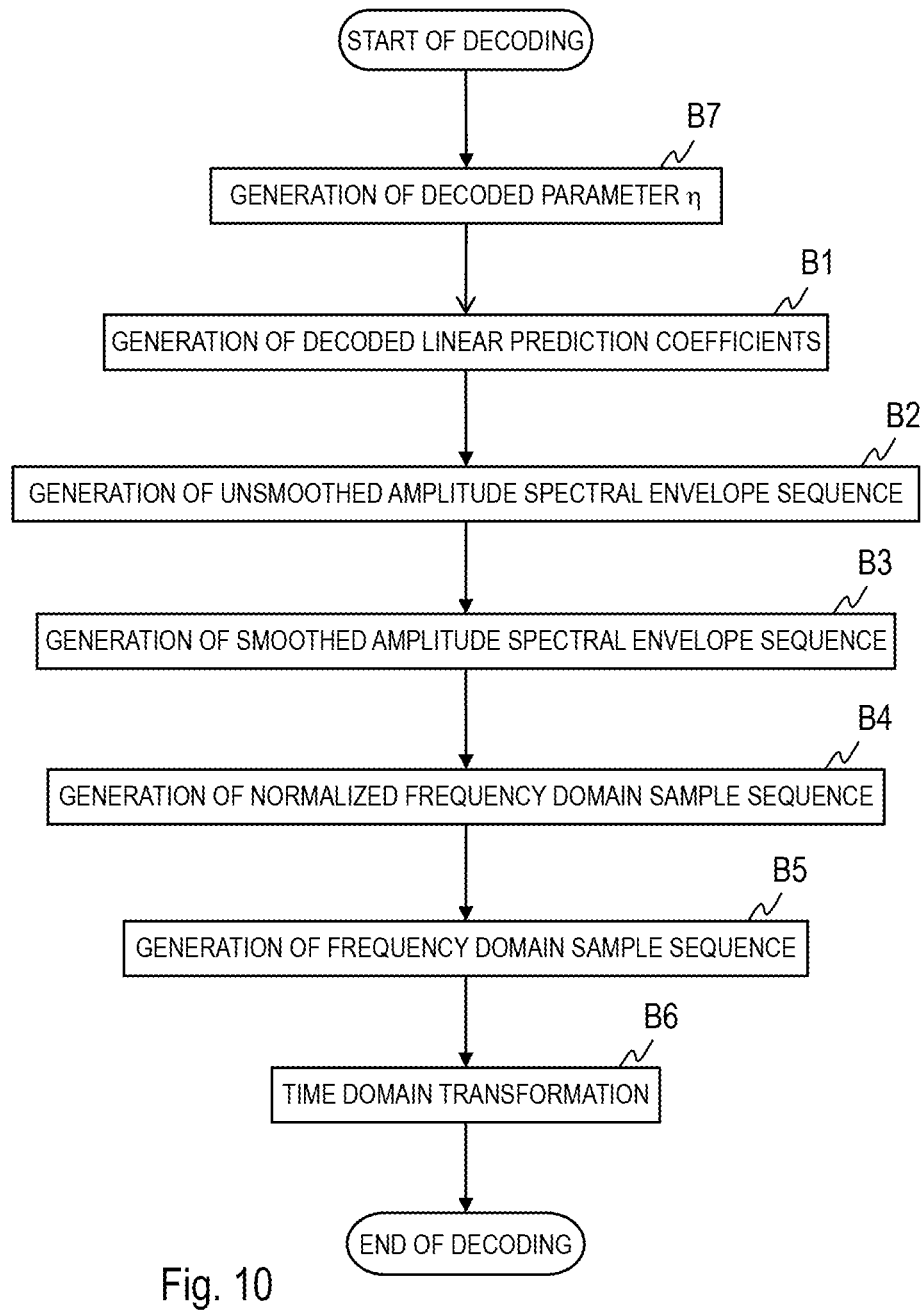
FIG. 10 is a flowchart for illustrating an example of a decoding method.

FIG. 9 shows a configuration example of the decoding apparatus corresponding to the encoding apparatus. As shown in FIG. 9, the decoding apparatus is, for example, provided with a linear prediction coefficient decoding portion 31, an unsmoothed amplitude spectral envelope sequence generating portion 32, a smoothed amplitude spectral envelope sequence generating portion 33, a decoding portion 34, an envelope denormalizing portion 35, a time domain transforming portion 36 and a parameter decoding portion 37. FIG. 10 shows an example of each process of a decoding method realized by this decoding apparatus.

At least a parameter code, codes corresponding to a normalized MDCT coefficient sequence and linear prediction coefficient codes outputted by the encoding apparatus are inputted to the decoding apparatus.

Each portion in FIG. 9 will be described below.

<Parameter Decoding Portion 37>

The parameter code outputted by the encoding apparatus is inputted to the parameter decoding portion 37.

The parameter decoding portion 37 determines a decoded parameter η by decoding the parameter code. The decoded parameter η which has been determined is outputted to the unsmoothed amplitude spectrum envelope sequence generating portion 32, the smoothed amplitude spectrum envelope sequence generating portion 33 and the decoding portion 34.

<Linear Prediction Coefficient Decoding Portion 31>

The linear prediction coefficient codes outputted by the encoding apparatus are inputted to the linear prediction coefficient decoding portion 31.

For each frame, the linear prediction coefficient decoding portion 31 decodes the inputted linear prediction coefficient codes, for example, by a conventional decoding technique to obtain decoded linear prediction coefficients $\hat{\beta}_1, \hat{\beta}_2, \ldots, \hat{\beta}_p$ (step B1).

The obtained decoded linear prediction coefficients $\hat{\beta}_1, \hat{\beta}_2, \ldots, \hat{\beta}_p$ are outputted to the unsmoothed amplitude spectral envelope sequence generating portion 32 and the unsmoothed amplitude spectral envelope sequence generating portion 33.

Here, the conventional decoding technique is, for example, a technique in which, when the linear prediction coefficient codes are codes corresponding to quantized linear prediction coefficients, the linear prediction coefficient codes are decoded to obtain decoded linear prediction coefficients which are the same as the quantized linear prediction coefficients, a technique in which, when the linear prediction coefficient codes are codes corresponding to quantized LSP parameters, the linear prediction coefficient codes are decoded to obtain decoded LSP parameters which are the same as the quantized LSP parameters, or the like. Further, the linear prediction coefficients and the LSP parameters are mutually transformable, and it is well known that a transformation process can be performed between the decoded linear prediction coefficients and the decoded LSP parameters according to inputted linear prediction coefficient codes and information required for subsequent processes. From the above, it can be said that what comprises the above linear prediction coefficient code decoding process and the above transformation process performed as necessary is "decoding by the conventional decoding technique".

In this way, the linear prediction coefficient decoding portion 31 generates coefficients transformable to linear prediction coefficients corresponding to a pseudo correlation function signal sequence obtained by performing inverse Fourier transform regarding the η-th power of absolute values of a frequency domain sequence corresponding to a time-series signal as a power spectrum, by decoding inputted linear prediction codes.

<Unsmoothed Amplitude Spectral Envelope Sequence Generating Portion 32>

The decoded parameter η determined by the parameter decoding portion 37 and the decoded linear prediction coefficients $\hat{\beta}_1, \hat{\beta}_2, \ldots, \hat{\beta}_p$ obtained by the linear prediction coefficient decoding portion 31 are inputted to the unsmoothed amplitude spectral envelope sequence generating portion 32.

The unsmoothed amplitude spectral envelope sequence generating portion 32 generates an unsmoothed amplitude spectral envelope sequence $\hat{H}(0), \hat{H}(1), \ldots, \hat{H}(N-1)$, which is a sequence of an amplitude spectral envelope corresponding to the decoded linear prediction coefficients $\hat{\beta}_1, \hat{\beta}_2, \ldots, \hat{\beta}_p$ by the above expression (A2) (step B2).

The generated unsmoothed amplitude spectral envelope sequence $\hat{H}(0), \hat{H}(1), \ldots, \hat{H}(N-1)$ is outputted to the decoding portion 34.

In this way, the unsmoothed amplitude spectral envelope sequence generating portion 32 obtains an unsmoothed spectral envelope sequence, which is a sequence obtained by raising a sequence of an amplitude spectral envelope corresponding to coefficients transformable to linear prediction coefficients generated by the linear prediction coefficient decoding portion 31 to the power of 1/η.

<Smoothed Amplitude Spectral Envelope Sequence Generating Portion 33>

The decoded parameter η determined by the parameter decoding portion 37 and the decoded linear prediction coefficients $\hat{\beta}_1, \hat{\beta}_2, \ldots, \hat{\beta}_p$ obtained by the linear prediction coefficient decoding portion 31 are inputted to the smoothed amplitude spectral envelope sequence generating portion 33.

The smoothed amplitude spectral envelope sequence generating portion 33 generates a smoothed amplitude spectral envelope sequence $\hat{H}_\gamma(0), \hat{H}_\gamma(1), \ldots, \hat{H}_\gamma(N-1)$, which is a sequence obtained by reducing amplitude unevenness of a sequence of an amplitude spectral envelope corresponding to the decoded linear prediction coefficients $\hat{\beta}_1, \hat{\beta}_2, \ldots, \hat{\beta}_p$, by the above expression A(3) (step B3).

The generated smoothed amplitude spectral envelope sequence $\hat{H}_\gamma(0), \hat{H}_\gamma(1), \ldots, \hat{H}_\gamma(N-1)$ is outputted to the decoding portion 34 and the envelope denormalizing portion 35.

<Decoding Portion 34>

The decoded parameter η determined by the parameter decoding portion 37, codes corresponding to the normalized MDCT coefficient sequence outputted by the encoding apparatus, the unsmoothed amplitude spectral envelope sequence $\hat{H}(0), \hat{H}(1), \ldots, \hat{H}(N-1)$ generated by the unsmoothed amplitude spectral envelope generating portion 32 and the smoothed amplitude spectral envelope sequence $\hat{H}_\gamma(0), \hat{H}_\gamma(1), \ldots, \hat{H}_\gamma(N-1)$ generated by the smoothed amplitude spectral envelope generating portion 33 are inputted to the decoding portion 34.

The decoding portion 34 is provided with a variance parameter determining portion 342.

Figure 11:
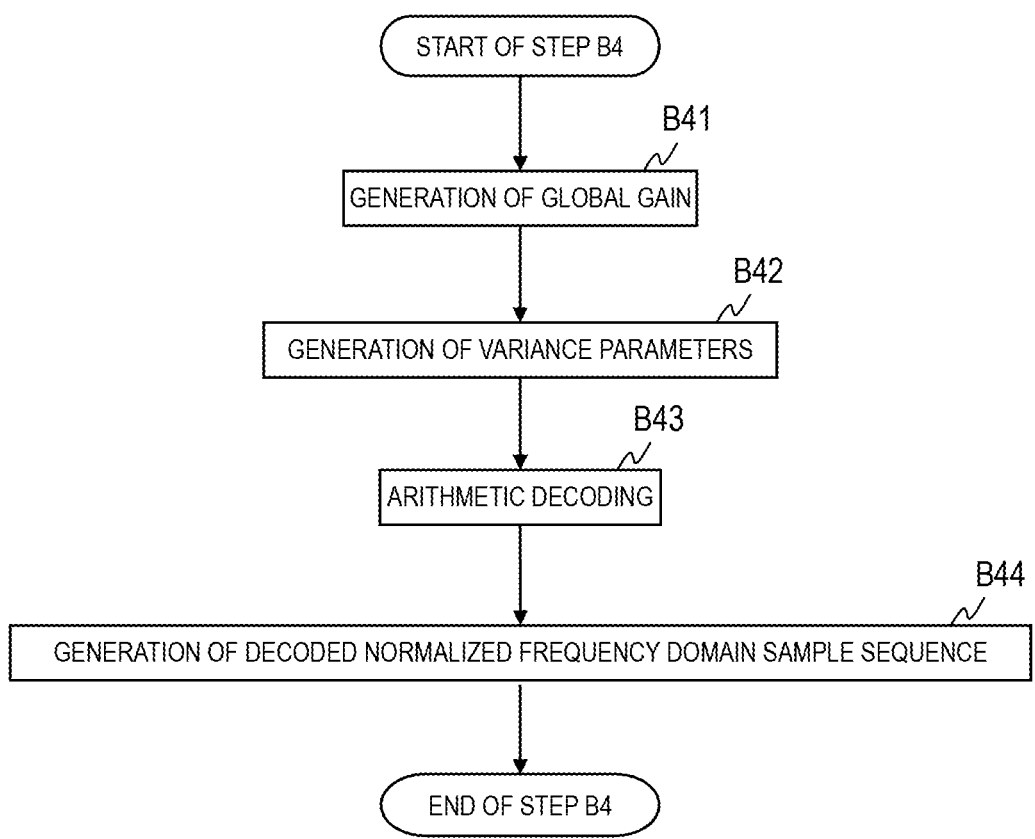
FIG. 11 is a flowchart for illustrating an example of a process of a decoding portion.
Figure 12:
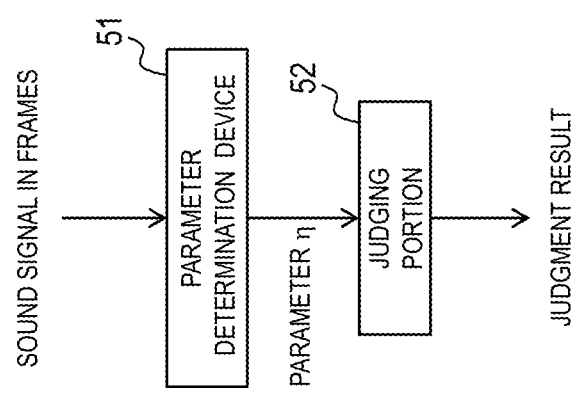
FIG. 12 is a block diagram for illustrating an example of a sound classification apparatus.

The decoding portion 34 performs decoding, for example, by performing processes of steps B41 to B44 shown in FIG. 11 (step B4). That is, for each frame, the decoding portion 34 decodes a gain code comprised in the codes corresponding to the inputted normalized MDCT coefficient sequence to obtain a global gain g (step B41). The variance parameter determining portion 342 of the decoding portion 34 determines each variance parameter of a variance parameter sequence $\varphi(0), \varphi(1), \ldots, \varphi(N-1)$ from the global gain g, the unsmoothed amplitude spectral envelope sequence $\hat{H}(0), \hat{H}(1), \ldots, \hat{H}(N-1)$ and the smoothed amplitude spectral envelope sequence $\hat{H}_\gamma(0), \hat{H}_\gamma(1), \ldots, \hat{H}_\gamma(N-1)$ by the above expression (A1) (step B42). The decoding portion 34 obtains a decoded normalized coefficient sequence $\hat{X}_Q(0), \hat{X}_Q(1), \ldots, \hat{X}_Q(N-1)$ by performing arithmetic decoding of integer signal codes comprised in the codes corresponding to the normalized MDCT coefficient sequence in accordance with an arithmetic decoding configuration corresponding to the variance parameters of the variance parameter sequence $\varphi(0), \varphi(1), \ldots, \varphi(N-1)$ (step B43) and generates a decoded normalized MDCT coefficient sequence $\hat{X}_N(0), \hat{X}_N(1), \ldots, \hat{X}_N(N-1)$ by multiplying each coefficient of the decoded normalized coefficient sequence $\hat{X}_Q(0), \hat{X}_Q(1), \ldots, \hat{X}_Q(N-1)$ by the global gain g (step B44). Thus, the decoding portion 34 may decode inputted integer signal codes in accordance with bit allocation which substantially changes based on an unsmoothed spectral envelope sequence.

When encoding is performed by the process described in [Modification of encoding portion 26], the decoding portion 34 performs, for example, the following process. For each frame, the decoding portion 34 decodes a gain code comprised in the codes corresponding to an inputted normalized MDCT coefficient sequence to obtain a global gain g. The variance parameter determining portion 342 of the decoding portion 34 determines each variance parameter of a variance parameter sequence $\varphi(0), \varphi(1), \ldots, \varphi(N-1)$ from an unsmoothed amplitude spectral envelope sequence $\hat{H}(0), \hat{H}(1), \ldots, \hat{H}(N-1)$ and a smoothed amplitude spectral envelope sequence $\hat{H}_\gamma(0), \hat{H}_\gamma(1), \ldots, \hat{H}_\gamma(N-1)$ by the above expression (A9). The decoding portion 34 can determine b(k) by the expression (A10), based on each variance parameter $\varphi(k)$ of the variance parameter sequence $\varphi(0), \varphi(1), \ldots, \varphi(N-1)$. The decoding portion 34 obtains a decoded normalized coefficient sequence $\hat{X}_Q(0), \hat{X}_Q(1), \ldots, \hat{X}_Q(N-1)$ by sequentially decoding values of $X_Q(k)$ with the number of bits b(k), and generates a decoded normalized MDCT coefficient sequence $\hat{X}_N(0), \hat{X}_N(1), \ldots, \hat{X}_N(N-1)$ by multiplying each coefficient of the decoded normalized coefficient sequence $\hat{X}_Q(0), \hat{X}_Q(1), \ldots, \hat{X}_Q(N-1)$ by the global gain g. Thus, the decoding portion 34 may decode inputted integer signal codes in accordance with bit allocation which changes based on an unsmoothed spectral envelope sequence.

The decoded normalized MDCT coefficient sequence $\hat{X}_N(0), \hat{X}_N(1), \ldots, \hat{X}_N(N-1)$ which has been generated is outputted to the envelope denormalizing portion 35.

<Envelope Denormalizing Portion 35>

The smoothed amplitude spectral envelope sequence $\hat{H}_\gamma(0), \hat{H}_\gamma(1), \ldots, \hat{H}_\gamma(N-1)$ generated by the smoothed amplitude spectral envelope generating portion 33 and the decoded normalized MDCT coefficient sequence $\hat{X}_N(0), \hat{X}_N(1), \ldots, \hat{X}_N(N-1)$ generated by the decoding portion 34 are inputted to the envelope denormalizing portion 35.

The envelope denormalizing portion 35 generates a decoded MDCT coefficient sequence $\hat{X}(0), \hat{X}(1), \ldots, \hat{X}(N-1)$ by denormalizing the decoded normalized MDCT coefficient sequence $\hat{X}_N(0), \hat{X}_N(1), \ldots, \hat{X}_N(N-1)$ using the smoothed amplitude spectral envelope sequence $\hat{H}_\gamma(0), \hat{H}_\gamma(1), \ldots, \hat{H}_\gamma(N-1)$ (step B5).

The generated decoded MDCT coefficient sequence $\hat{X}(0), \hat{X}(1), \ldots, \hat{X}(N-1)$ is outputted to the time domain transforming portion 36.

For example, the envelope denormalizing portion 35 generates the decoded MDCT coefficient sequence $\hat{X}(0), \hat{X}(1), \ldots, \hat{X}(N-1)$ by multiplying coefficients $\hat{X}_N(k)$ of the decoded normalized MDCT coefficient sequence $\hat{X}(0), \hat{X}_N(1), \ldots, \hat{X}_N(N-1)$ by envelope values $\hat{H}_\gamma(k)$ of the smoothed amplitude spectral envelope sequence $\hat{H}_\gamma(0), \hat{H}_\gamma(1), \ldots, \hat{H}_\gamma(N-1)$, respectively, on the assumption of $k=0, 1, \ldots, N-1$. That is, $\hat{X}(k)=\hat{X}_N(k) \times \hat{H}_\gamma(k)$ is satisfied on the assumption of $k=0, 1, \ldots, N-1$.

<Time Domain Transforming Portion 36>

The MDCT coefficient sequence $\hat{X}(0), \hat{X}(1), \ldots, \hat{X}(N-1)$ generated by the envelope denormalizing portion 35 is inputted to the time domain transforming portion 36.

For each frame, the time domain transforming portion 36 transforms the decoded MDCT coefficient sequence $\hat{X}(0), \hat{X}(1), \ldots, \hat{X}(N-1)$ obtained by the envelope denormalizing portion 35 to a time domain and obtains a sound signal (a decoded sound signal) for each frame (step B6).

In this way, the decoding apparatus obtains a time-series signal by decoding in the frequency domain.

[Sound Classification Apparatus and Method Using Parameter Determination Device and Method]

An example of a sound classification apparatus and method using the parameter determination device and method will be described below.

Figure 13:
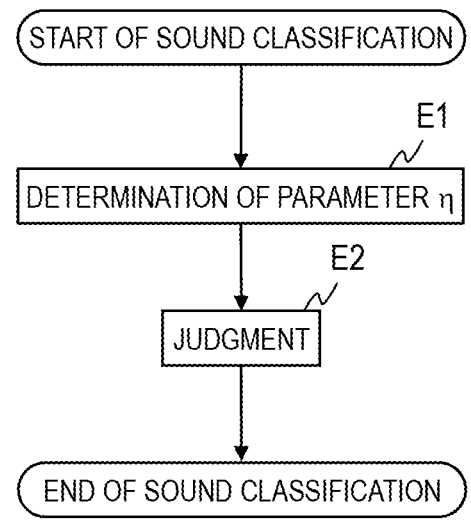
FIG. 13 is a flowchart for illustrating an example of a sound classification method.

As shown in FIG. 13, the sound classification apparatus is provided with, for example, a parameter determination device 51 and a judging portion 52. The sound classification method is realized by this sound classification apparatus performing a process illustrated below and in FIG. 13.

The parameter determination device 51 is the parameter determination device described above and determines a parameter η by the process described above (step E1). The determined η is outputted to the judging portion 52.

When the parameter η determined by the parameter determination device and method is smaller than a predetermined threshold, the judging portion 52 classifies a section of a time-series signal corresponding to the parameter η as music and, otherwise, classifies the section as voice (step E2).

The sound classification apparatus and method are based on a property that, the smaller the parameter η is, the larger the stationarity of a corresponding time-series signal is.

[Modifications and the Like]

The parameter determination device or method may determine the parameter η by a loop process. That is, the parameter determination device or method may further perform the processes of the spectral envelope estimating portion 42, the whitened spectral sequence generating portion 43 and the parameter acquiring portion 44 in which the parameter η determined by the parameter acquiring portion 44 is a parameter $\eta_0$ specified by a predetermined method once or more times.

In this case, for example, as indicated by a broken line in FIG. 1, the parameter η determined by the parameter acquiring portion 44 is outputted to the spectral envelope estimating portion 42. The spectral envelope estimating portion 42 performs a process similar to the process described above to perform estimation of a spectral envelope, based on the η determined by the parameter acquiring portion 44. The whitened spectral sequence generating portion 43 performs a process similar to the process described above to generate a whitened spectral sequence, based on the newly estimated spectral envelope. The parameter acquiring portion 44 performs a process similar to the process described above to determine a parameter based on the newly generated whitened spectral sequence.

For example, the processes of the spectral envelope estimating portion 42, the whitened spectral sequence generating portion 43 and the parameter acquiring portion 44 may be further performed τ times, which is a predetermined number of times. Here, τ is a predetermined positive integer, for example, τ=1 or τ=2.

Further, the spectral envelope estimating portion 42 may repeat the processes of the spectral envelope estimating portion 42, the whitened spectral sequence generating portion 43 and the parameter acquiring portion 44 until an absolute value of a difference between the parameter η determined this time and a parameter η determined last becomes a predetermined threshold or smaller.

When the linear prediction analyzing portion 22 and the unsmoothed amplitude spectral envelope sequence generating portion 23 are grasped as one spectral envelope estimating portion 2A, it can be said that this spectral envelope estimating portion 2A performs estimation of a spectral envelope regarding the η-th power of absolute values of a frequency domain sequence, which is, for example, an MDCT coefficient sequence, corresponding to a time-series signal, as a power spectrum (an unsmoothed amplitude spectral envelope sequence). Here, "regarding . . . as a power spectrum" means that a spectrum raised to the power of η is used where a power spectrum is usually used.

In this case, it can be said that, the linear prediction analyzing portion 22 of the spectral envelope estimating portion 2A performs linear prediction analysis using a pseudo correlation function signal sequence obtained by performing inverse Fourier transform regarding the η-th power of absolute values of a frequency domain sample sequence, which is, for example, an MDCT coefficient sequence, as a power spectrum, and obtains coefficients transformable to linear prediction coefficients. Further, it can be said that the unsmoothed amplitude spectral envelope sequence generating portion 23 of the spectral envelope estimating portion 2A performs estimation of a spectral envelope by obtaining an unsmoothed spectral envelope sequence, which is a sequence obtained by raising a sequence of an amplitude spectral envelope corresponding to coefficients transformable to linear prediction coefficients obtained by the linear prediction analyzing portion 22 to the power of 1/η.

Further, when the smoothed amplitude spectral envelope sequence generating portion 24, the envelope normalizing portion 25 and the encoding portion 26 are grasped as one encoding portion 2B, it can be said that this encoding portion 2B performs such encoding that changes bit allocation or that bit allocation substantially changes based on a spectral envelope (an unsmoothed amplitude spectral envelope sequence) estimated by the spectral envelope estimating portion 2A, for each coefficient of a frequency domain sample sequence which is, for example, an MDCT coefficient sequence.

When the decoding portion 34 and the envelope denormalizing portion 35 are grasped as one decoding portion 3A, it can be said that this decoding portion 3A obtains a frequency domain sample sequence corresponding to a time-series sequence signal by performing decoding of inputted integer signal codes in accordance with such bit allocation that changes or substantially changes based on an unsmoothed spectral envelope sequence.

The processes described above are not only executed in order of description but also may be executed in parallel or individually according to processing capacity of an apparatus to execute the processes or as necessary.

Further, various processes in each method or each apparatus may be realized by a computer. In that case, content of the processes of each method or each apparatus is written by a program. Then, by executing this program on the computer, the various processes in each method or each apparatus are realized on the computer.

The program in which the content of the processes is written can be recorded in a computer-readable recording medium. As the computer readable recording medium, any recording medium, such as a magnetic recording device, an optical disk, a magneto-optical recording medium and a semiconductor memory, is possible.

Further, distribution of this program is performed, for example, by sales, transfer, lending and the like of a portable recording medium such as a DVD and a CD-ROM in which the program is recorded. Furthermore, this program may be distributed by storing the program in a storage apparatus of a server computer and transferring the program from the server computer to other computers via a network.

For example, a computer which executes such a program stores the program recorded in the portable recording medium or transferred from the server computer into its storage portion once. Then, at the time of executing a process, the computer reads the program stored in its storage portion and executes the process in accordance with the read program. Further, as another embodiment of this program, the computer may read the program directly from the portable recording medium and execute the process in accordance with the program. Furthermore, it is also possible for the computer to, each time the program is transferred from the server computer to the computer, execute a process in accordance with the received program one by one. Further, a configuration is also possible in which the processes described above are executed by a so-called ASP (Application Service Provider) type service for realizing a processing function only by an instruction to execute the program and acquisition of a result without transferring the program from the server computer to the computer. It is assumed that the program includes information which is provided for processing by an electronic calculator and is equivalent to a program (such as data which is not a direct instruction to a computer but has properties defining processing of the computer).

Further, though it is assumed that each apparatus is configured by executing a predetermined program on a computer, at least a part of content of processes of the apparatus may be realized by hardware.

What is claimed is:

1. A parameter determination device comprising:
processing circuitry configured to:
receive a time domain sound signal as a time-series signal;
perform estimation of a spectral envelope using a parameter $\eta_0$ specified in a predetermined method, regarding the $\eta_0$-th power of absolute values of a frequency domain sample sequence corresponding to the time-series signal as a power spectrum on the assumption that the parameter $\eta_0$ and a parameter $\eta$ are positive numbers;
obtain a whitened spectral sequence which is a sequence obtained by dividing the frequency domain sample sequence by the spectral envelope; and
determine, as a parameter representing the characteristic of the time-series signal, such a parameter $\eta$ that generalized Gaussian distribution with the parameter $\eta$ as a shape parameter approximates a histogram of the whitened spectral sequence.

2. The parameter determination device according to claim 1, wherein processes of the processing circuitry in which the parameter $\eta$ determined by the processing circuitry is caused to be the parameter $\eta_0$ specified in the predetermined method, are further performed once or more times.

3. The parameter determination device according to claim 1 or 2, wherein the processing circuitry determines the parameter $\eta$ based on a value of $m_{q1}$, which is a q1-th order moment of the whitened spectral sequence, and a value of $m_{q2}$, which is a q2-th order moment of the whitened spectral sequence, on the assumption that q1 and q2 are predetermined different positive integers.

4. The parameter determination device according to claim 3, wherein, on the assumption that N is a predetermined positive number, that k=0,1, . . . , N−1 is satisfied, that each value of the whitened spectral sequence is indicated by $X_W(k)$, that $\Gamma$ is a gamma function, and that $F^{-1}$ is an inverse function of a function F, $\eta$ determined by the parameter acquiring portion is defined by the following expression:

[Expression 15]

$$\eta = F'^{-1}\left(\frac{m_{q_1}}{(m_{q_2})^{q_1/q_2}}\right)$$

$$F'(\eta) = \frac{\Gamma((q_1+1)/\eta)}{(\Gamma(1/\eta))^{1-q_1/q_2}(\Gamma((q_2+1)/\eta))^{q_1/q_2}}$$

$$m_{q_1} = \frac{1}{N}\sum_{k=0}^{N-1}|X_W(k)|^{q_1}, \quad m_{q_2} = \frac{1}{N}\sum_{k=0}^{N-1}|X_W(k)|^{q_2}.$$

5. The parameter determination device according to claim 4, wherein the processing circuitry calculates $m_{q1}/((m_{q2})^{q1/q2})$ based on the whitened spectral sequence and, by referring to a plurality of different pairs of $\eta$ and $F(\eta)$ corresponding to $\eta$ prepared in advance, obtains $\eta$ corresponding to $F(\eta)$ closest to the calculated $m_{q1}/((m_{q2})^{q1/q2})$.

6. The parameter determination device according to claim 4, wherein, on the assumption that an approximate curve function of the inverse function $F^{-1}$ is $\sim F^{-1}$, the processing circuitry calculates $m_{q1}/((m_{q2})^{q1/q2})$ based on the whitened spectral sequence and determines $\eta$ by calculating an output value when the calculated $m_{q1}/((m_{q2})^{q1/q2})$ is inputted to the approximate curve function $\sim F^{-1}$.

7. The parameter determination device according to claim 1, wherein
the parameter determination device determines the parameter $\eta$ for each frame; and
the parameter $\eta_0$ specified in the predetermined method for a frame for which the parameter $\eta$ is to be determined currently is $\eta$ determined for a frame before the frame for which the parameter $\eta$ is to be determined currently.

8. A non-transitory computer-readable recording medium in which a program for causing a computer to function as each portion of the parameter determination device according to claim 1 is recorded.

9. The parameter determination method, implemented by a parameter determination device, comprising:
receiving, by processing circuitry of the parameter determination device, a time domain sound signal as a time-series signal;
a spectral envelope estimating step, by the processing circuitry, of performing estimation of a spectral envelope using a parameter $\eta_0$ specified in a predetermined method, regarding the $\eta_0$-th power of absolute values of a frequency domain sample sequence corresponding to the time-series signal as a power spectrum on the assumption that the parameter $\eta_0$ and a parameter $\eta$ are positive numbers;
a whitened spectral sequence generating step, by the processing circuitry, of obtaining a whitened spectral sequence which is a sequence obtained by dividing the frequency domain sample sequence by the spectral envelope; and
a parameter acquiring step, by the processing circuitry, of determining, as a parameter representing the characteristic of the time-series signal, such a parameter $\eta$ that generalized Gaussian distribution with the parameter $\eta$ as a shape parameter approximates a histogram of the whitened spectral sequence.

10. The parameter determination method according to claim 9, wherein processes of the spectral envelope estimating step, the whitened spectral sequence generating step and the parameter acquiring step, in which the parameter $\eta$ determined by the parameter acquiring portion is caused to be the parameter $\eta_0$ specified in the predetermined method, are further performed once or more times.

11. The parameter determination method according to claim 9 or 10, wherein the parameter acquiring step includes determining the parameter $\eta$ based on a value of $m_{q1}$, which is a q1-th order moment of the whitened spectral sequence, and a value of $m_{q2}$, which is a q2-th order moment of the whitened spectral sequence, on the assumption that q1 and q2 are predetermined different positive integers.

12. The parameter determination method according to claim 11, wherein, on the assumption that N is a predetermined positive number, that k=0,1, . . . , N−1 is satisfied, that each value of the whitened spectral sequence is indicated by $X_W(k)$, that $\Gamma$ is a gamma function, and that $F^{-1}$ is an inverse function of a function F, η determined by the parameter acquiring portion is defined by the following expression:

[Expression 16]

$$\eta = F'^{-1}\left(\frac{m_{q_1}}{(m_{q_2})^{q_1/q_2}}\right)$$

$$F'(\eta) = \frac{\Gamma((q_1+1)/\eta)}{(\Gamma(1/\eta))^{1-q_1/q_2}(\Gamma((q_2+1)/\eta)^{q_1/q_2})}$$

$$m_{q_1} = \frac{1}{N}\sum_{k=0}^{N-1}|X_W(k)|^{q_1}, \quad m_{q_2} = \frac{1}{N}\sum_{k=0}^{N-1}|X_W(k)|^{q_2}.$$

13. The parameter determination method according to claim 12, wherein the parameter acquiring step includes calculating $m_{q_1}/((m_{q_2})^{q_1/q_2})$ based on the whitened spectral sequence and, by referring to a plurality of different pairs of η and F(η) corresponding to η prepared in advance, obtains η corresponding to F(η) closest to the calculated $m_{q_1}/((m_{q_2})^{q_1/q_2})$.

14. The parameter determination method according to claim 12, wherein, on the assumption that an approximate curve function of the inverse function $F^{-1}$ is $\sim F^{-1}$, the parameter acquiring step includes calculating $m_{q_1}/((m_{q_2})^{q_1/q_2})$ based on the whitened spectral sequence and determines η by calculating an output value when the calculated $m_{q_1}/((m_{g_2})^{q_1/q_2})$ is inputted to the approximate curve function $\sim F^{-1}$.

15. The parameter determination method according to claim 9, wherein
the parameter determination method determines the parameter η for each frame; and
the parameter $η_0$ specified in the predetermined method for a frame for which the parameter η is to be determined currently is η determined for a frame before the frame for which the parameter η is to be determined currently.

* * * * *